United States Patent
Cho et al.

(10) Patent No.: US 10,993,022 B2
(45) Date of Patent: Apr. 27, 2021

(54) ELECTRONIC DEVICE INCLUDING VIBRATION DAMPING MEMBER

(71) Applicant: Samsung Electronics Co., Ltd., Suwon-si (KR)

(72) Inventors: Joonrae Cho, Suwon-si (KR); Junhee Han, Suwon-si (KR); Jaehyoung Park, Suwon-si (KR); Myeungseon Kim, Suwon-si (KR); Myoungsung Sim, Suwon-si (KR); Woojin Cho, Suwon-si (KR); Sanggon Shin, Suwon-si (KR); Junyoung Lee, Suwon-si (KR); Hochul Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/749,808

(22) Filed: Jan. 22, 2020

(65) Prior Publication Data
US 2020/0275191 A1    Aug. 27, 2020

(30) Foreign Application Priority Data
Feb. 25, 2019    (KR) .................. 10-2019-0021999

(51) Int. Cl.
*H05K 5/02*    (2006.01)
*H04R 1/28*    (2006.01)
(Continued)

(52) U.S. Cl.
CPC .............. *H04R 1/288* (2013.01); *F16F 1/373* (2013.01); *F16F 15/04* (2013.01); *H04R 1/025* (2013.01);
(Continued)

(58) Field of Classification Search
CPC .... H04R 1/288; H04R 1/025; H04R 2499/11; H05K 5/0217; F16F 1/373; F16F 15/04; H04M 1/02; G06F 1/1656; G06F 1/1658
See application file for complete search history.

(56) References Cited

U.S. PATENT DOCUMENTS 7,532,478 B2 *   5/2009   Jeong ....................... H05K 5/02
                                                                    361/715
8,411,432 B1 *   4/2013   Zimlin .................. G06F 1/1658
                                                                    361/679.55
(Continued)

FOREIGN PATENT DOCUMENTS

JP    2004-192750 A     7/2004
JP    2004-288830 A    10/2004
(Continued)

OTHER PUBLICATIONS

International Search Report dated May 7, 2020 in connection with International Patent Application No. PCT/KR2020/000236, 11 pages.

*Primary Examiner* — Abhishek M Rathod

(57) ABSTRACT

An electronic device includes a housing including a front plate forming a first surface, a back plate forming a second surface, and a side member forming a side surface surrounding a space between the first and second surfaces; a sound output device disposed in the housing; an electrical component disposed in the housing and having a variable thickness; and a vibration damping member disposed on at least part of the electrical component or formed between the electrical component and the back plate. The vibration damping member is disposed in a variable space having a thickness varying depending on a thickness variation of the electrical component. The vibration damping member has a height varying in a thickness direction of the variable space to correspond to the thickness of the variable space and divides the variable space into a plurality of sub-spaces when the variable space has a specified thickness or more.

20 Claims, 26 Drawing Sheets

(51) Int. Cl.
  *F16F 1/373* (2006.01)
  *F16F 15/04* (2006.01)
  *H04R 1/02* (2006.01)

(52) U.S. Cl.
  CPC ........ *H05K 5/0217* (2013.01); *H04R 2499/11* (2013.01)

(56) References Cited

U.S. PATENT DOCUMENTS

| | | | |
|---|---|---|---|
| 8,649,168 B2 * | 2/2014 | Ozeki | G06F 1/187 |
| | | | 361/679.35 |
| 9,250,658 B2 * | 2/2016 | Iwamoto | G06F 1/187 |
| 10,609,828 B2 * | 3/2020 | Cui | F16F 15/04 |
| 2002/0043608 A1 | 4/2002 | Nakata et al. | |
| 2005/0039995 A1 * | 2/2005 | Inoke | G06F 1/1658 |
| | | | 188/371 |
| 2008/0291618 A1 * | 11/2008 | Sheng | G11B 33/08 |
| | | | 361/679.34 |
| 2009/0304209 A1 | 12/2009 | Nakatani | |
| 2018/0229808 A1 | 8/2018 | Wang et al. | |

FOREIGN PATENT DOCUMENTS

| | | |
|---|---|---|
| KR | 10-0636092 B1 | 10/2006 |
| KR | 10-2011-0076304 A | 7/2011 |

* cited by examiner

ELECTRONIC DEVICE INCLUDING VIBRATION DAMPING MEMBER

CROSS-REFERENCE TO RELATED APPLICATION

This application is based on and claims priority under 35 U.S.C. § 119 to Korean Patent Application No. 10-2019-0021999, filed on Feb. 25, 2019, in the Korean Intellectual Property Office, the disclosure of which is incorporated by reference herein its entirety.

BACKGROUND

1. Field

The disclosure relates to a technology for implementing an electronic device including a vibration damping member.

2. Description of Related Art

A sound output device, such as a speaker, may be mounted in an electronic device. When a sound part is driven, the sound output device may vibrate to make a sound. Air adjacent to the sound output device and present in the interior space of the electronic device may vibrate when the sound part vibrates.

The sound output device may vibrate the air in the electronic device while vibrating. To protect other components or an electrical component in the electronic device and prevent vibration of the electrical component, a fixing member for fixing the electrical component may be disposed in the electronic device.

The above information is presented as background information only to assist with an understanding of the disclosure. No determination has been made, and no assertion is made, as to whether any of the above might be applicable as prior art with regard to the disclosure.

SUMMARY

In the case where the thickness of the electrical component in the electronic device is fixed, the electrical component in the electronic device may be fixed by the fixing member, and thus vibration of the other components may be prevented. However, in the case where the thickness of the electrical component in the electronic device is varied, it is not easy to dispose the fixing member to suit any one situation. For example, in the case where the fixing member is disposed to correspond to a small thickness of the electrical component, the electrical component may apply pressure to the interior of the housing of the electronic device, or the housing of the electronic device may inflate, when the thickness of the electrical component is increased. In another example, in the case where the fixing member is disposed to correspond to a large thickness of the electrical component, a variable space may be formed in the electronic device when the thickness of the electrical component is decreased. In the case where there is no component for reducing vibration, a single variable space may be formed, and vibration with high intensity may be caused by the single variable space.

Furthermore, in the case where spaces in which air is present in the electronic device are connected, the air may vibrate in a single mass, and therefore the vibration may be intensified. In this case, the vibration caused by the air in the electronic device may be increased to affect output sounds.

Aspects of the disclosure are to address at least the above-mentioned problems and/or disadvantages and to provide at least the advantages described below. Accordingly, an aspect of the disclosure is to provide an electronic device including a vibration damping member for preventing vibration of an electrical component in the electronic device and reducing vibration caused by air in the electronic device.

In accordance with an aspect of the disclosure, an electronic device includes a housing including a front plate that forms a first surface, a back plate that forms a second surface, and a side member that forms a side surface surrounding a space between the first surface and the second surface, a sound output device disposed in the housing, an electrical component that is disposed in the housing and that has a variable thickness, and a vibration damping member disposed on at least part of the electrical component or formed between the electrical component and the back plate, the vibration damping member being disposed in a variable space having a thickness varying depending on a thickness variation of the electrical component, in which the vibration damping member has a height varying in a thickness direction of the variable space to correspond to the thickness of the variable space and divides the variable space into a plurality of sub-spaces when the variable space has a specified thickness or more.

In accordance with another aspect of the disclosure, an electronic device includes a housing including a front plate that forms a first surface, a back plate that forms a second surface, and a side member that forms a side surface surrounding a space between the first surface and the second surface, a sound output device disposed in the housing, an electrical component that is disposed in the housing to form a variable space with the back plate and that has a variable thickness, and a vibration damping member disposed on at least part of the electrical component or disposed in the variable space, in which the vibration damping member has a plurality of folds that cause the vibration damping member to be folded in the variable space and divides the variable space into a plurality of sub-spaces while being folded along the plurality of folds, when the variable space has a specified thickness or more.

In accordance with another aspect of the disclosure, an electronic device includes a housing including a front plate that forms a first surface, a back plate that forms a second surface, and a side member that forms a side surface surrounding a space between the first surface and the second surface, a sound output device disposed in the housing, an electrical component that is disposed in the housing to form a variable space with the back plate and that has a variable thickness, and a vibration damping member disposed on at least part of the electrical component or disposed in the variable space, in which the vibration damping member is disposed such that at least part thereof makes contact with the electrical component or the back plate, and when the variable space has a specified thickness or more, the vibration damping member divides the variable space into a plurality of sub-spaces while making contact with the electrical component and the back plate at a plurality of points.

Other aspects, advantages, and salient features of the disclosure will become apparent to those skilled in the art from the following detailed description, which, taken in conjunction with the annexed drawings, discloses various embodiments of the disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The above and other aspects, features, and advantages of certain embodiments of the disclosure will be more apparent from the following description taken in conjunction with the accompanying drawings, in which.

With regard to the description of the drawings, identical or similar reference numerals may be used to refer to identical or similar components.

DETAILED DESCRIPTION

FIGS. 1 through 14, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, various embodiments of the disclosure will be described with reference to the accompanying drawings. However, those of ordinary skill in the art will recognize that modification, equivalent, and/or alternative on the various embodiments described herein can be variously made without departing from the scope and spirit of the disclosure.

Figure 1:
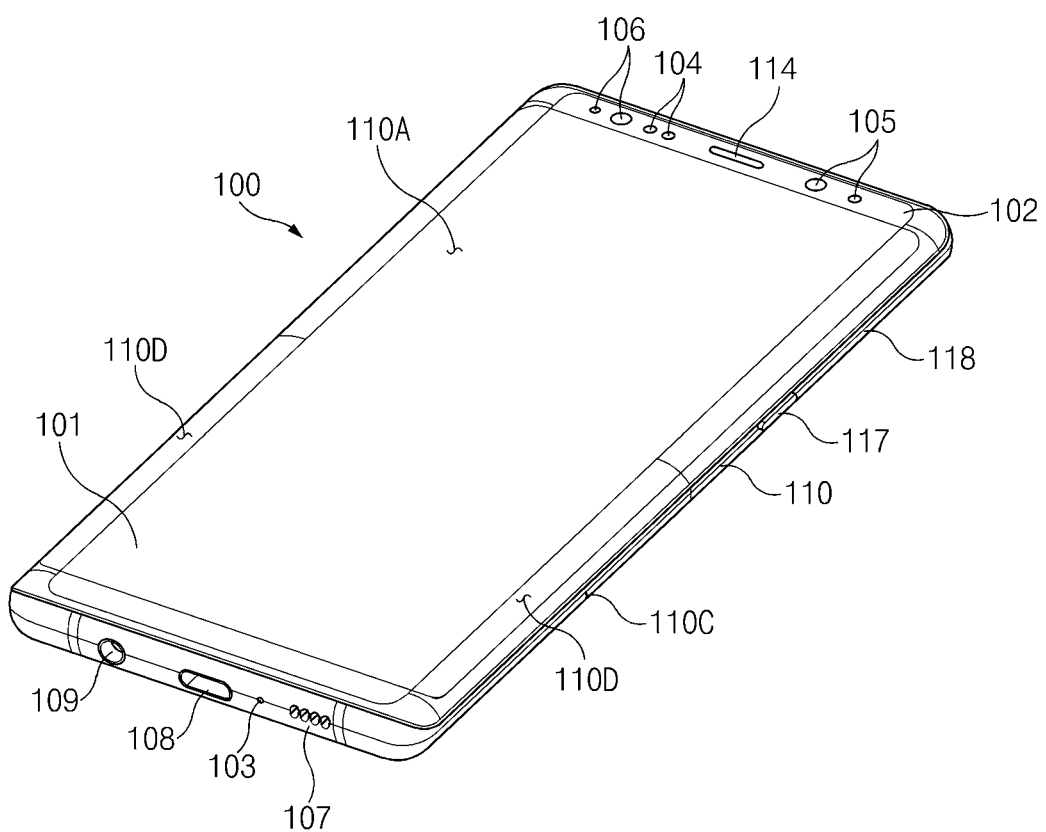
FIG. 1 illustrates a front perspective view of a mobile electronic device according to an embodiment.
Figure 2:
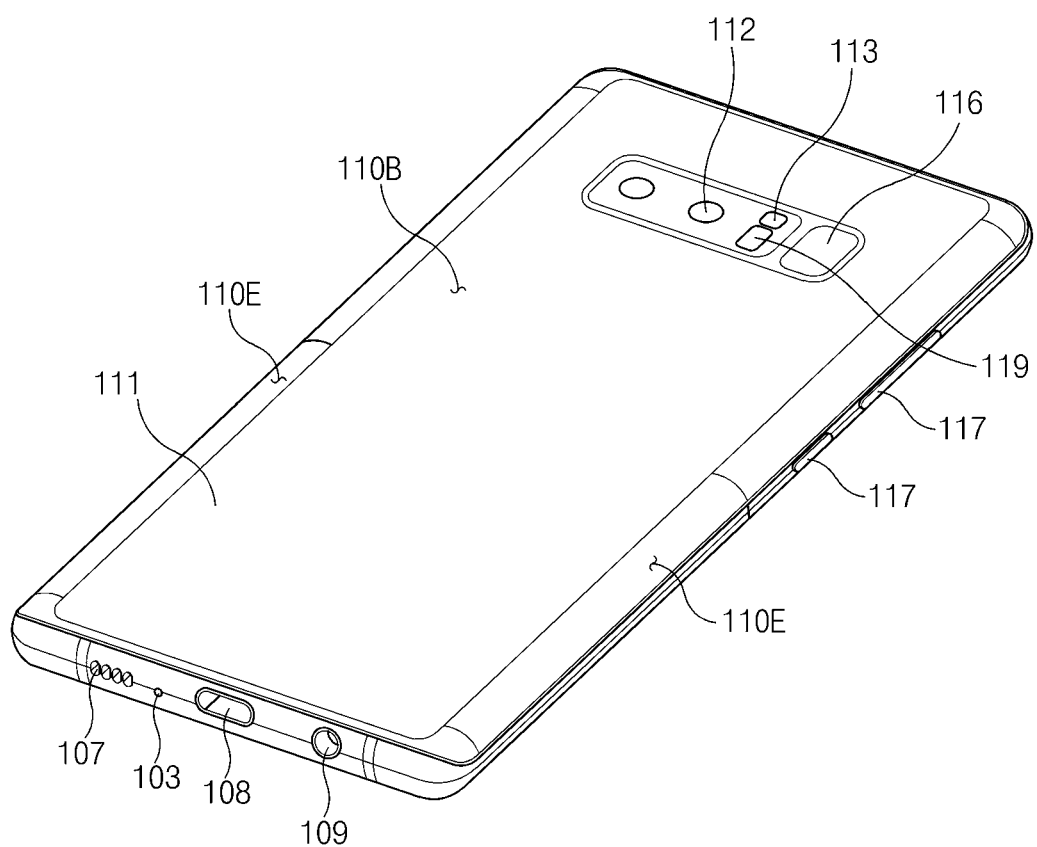
FIG. 2 illustrates a rear perspective view of the electronic device of FIG. 1.

Referring to FIGS. 1 and 2, an electronic device 100 according to an embodiment may include a housing 110 that includes a first surface (or a front surface) 110A, a second surface (or a rear surface) 110B, and side surfaces 110C that surround a space between the first surface 110A and the second surface 110B. In an embodiment, a housing may refer to a structure that forms some of the first surface 110A, the second surface 110B, and the side surfaces 110C of FIG. 1. According to an embodiment, the first surface 110A may be formed by a front plate 102, at least a portion of which is substantially transparent (e.g., a glass plate or a polymer plate that includes various coating layers). The second surface 110B may be formed by a back plate 111 that is substantially opaque. The back plate 111 may be formed of, for example, coated or colored glass, ceramic, a polymer, metal (e.g., aluminum, stainless steel (STS), or magnesium), or a combination of at least two thereof. The side surfaces 110C may be formed by a side bezel structure (or a "side member") 118 that is coupled with the front plate 102 and the back plate 111 and that contains metal and/or a polymer. In some embodiments, the back plate 111 and the side bezel structure 118 may be integrally formed with each other and may contain the same material (e.g., a metallic material such as aluminum).

In the illustrated embodiment, the front plate 102 may include, at opposite long edges thereof, two first areas 110D that curvedly and seamlessly extend toward the back plate 111 from the first surface 110A. In the illustrated embodiment (refer to FIG. 2), the back plate 111 may include, at opposite long edges thereof, two second areas 110E that curvedly and seamlessly extend toward the front plate 102 from the second surface 110B. In some embodiments, the front plate 102 (or the back plate 111) may include one of the first areas 110D (or the second areas 110E). In an embodiment, a part of the first areas 110D or the second areas 110E may not be included. In the embodiments, when viewed from a side of the electronic device 100, the side bezel structure 118 may have a first thickness (or width) at sides not including the first areas 110D or the second areas 110E and may have a second thickness smaller than the first thickness at sides including the first areas 110D or the second areas 110E.

According to an embodiment, the electronic device 100 may include at least one of a display 101, audio modules 103, 107, and 114, sensor modules 104, 116, and 119, camera modules 105, 112, and 113, key input devices 117, a light emitting element 106, and connector holes 108 and 109. In some embodiments, the electronic device 100 may omit at least one component (e.g., the key input devices 117 or the light emitting element 106) among the aforementioned components, or may additionally include other component(s).

The display 101 may be exposed through, for example, a large portion of the front plate 102. In some embodiments, at least part of the display 101 may be exposed through the front plate 102 that forms the first surface 110A and the first areas 110D of the side surfaces 110C. In some embodiments, the edge of the display 101 may be formed to be substantially the same as the shape of the adjacent periphery of the front plate 102. In an embodiment, the gap between the periphery of the display 101 and the periphery of the front plate 102 may be substantially constant to expand the area by which the display 101 is exposed.

In an embodiment, recesses or openings may be formed in a portion of a screen display area of the display 101, and the electronic device 100 may include at least one of the audio module 114, the sensor module 104, the camera module 105, and the light emitting element 106 that are aligned with the recesses or the openings. In an embodiment, the electronic device 100 may include, on a rear surface of the screen display area of the display 101, at least one of the audio module 114, the sensor module 104, the camera module 105, the fingerprint sensor 116, and the light emitting element 106. In an embodiment, the display 101 may be combined with, or disposed adjacent to, touch detection circuitry, a pressure sensor for measuring the intensity (pressure) of a touch, and/or a digitizer for detecting a stylus pen of a magnetic type. In some embodiments, at least a part of the sensor modules 104 and 119 and/or at least a part of the key input devices 117 may be disposed in the first areas 110D and/or the second areas 110E.

The audio modules 103, 107, and 114 may include the microphone hole 103 and the speaker holes 107 and 114. A microphone for obtaining a sound from the outside may be disposed in the microphone hole 103, and in some embodiments, a plurality of microphones may be disposed in the microphone hole 103 to sense the direction of a sound. The speaker holes 107 and 114 may include the external speaker hole 107 and the receiver hole 114 for a telephone call. In some embodiments, the speaker holes 107 and 114 and the microphone hole 103 may be implemented with one hole, and a speaker (e.g., a piezoelectric speaker) may be included without the speaker holes 107 and 114.

The sensor modules 104, 116, and 119 may generate an electrical signal or a data value that corresponds to an operational state inside the electronic device 100 or an environmental state external to the electronic device 100. The sensor modules 104, 116, and 119 may include, for example, the first sensor module 104 (e.g., a proximity sensor) and/or the second sensor module (e.g., a fingerprint sensor) that is disposed on the first surface 110A of the housing, and/or the third sensor module 119 (e.g., an HRM sensor) and/or the fourth sensor module 116 (e.g., a fingerprint sensor) that is disposed on the second surface 110B of the housing 110. The fingerprint sensor may be disposed not only on the first surface 110A of the housing 110 (e.g., the display 101) but also on the second surface 110B. The electronic device 100 may further include a non-illustrated sensor module, which may be, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or the illuminance sensor 104.

The camera modules 105, 112, and 113 may include the first camera device 105 disposed on the first surface 110A of the electronic device 100, and the second camera device 112 and/or the flash 113 disposed on the second surface 110B. The camera devices 105 and 112 may include one or more lenses, an image sensor, and/or an image signal processor. The flash 113 may include, for example, a light emitting diode or a xenon lamp. In some embodiments, two or more lenses (an IR camera lens, a wide angle lens, and a telephoto lens) and image sensors may be disposed on one surface of the electronic device 100.

The key input devices 117 may be disposed on the side surfaces 110C of the housing 110. In an embodiment, the electronic device 100 may not include all or some of the aforementioned key input devices 117, and the key input devices 117 not included may be implemented in different forms such as soft keys on the display 101. In some embodiments, the key input devices 117 may include the sensor module 116 disposed on the second surface 110B of the housing 110.

The light emitting element 106 may be disposed on, for example, the first surface 110A of the housing 110. The light emitting element 106 may provide, for example, state information of the electronic device 100 in the form of light. In an embodiment, the light emitting element 106 may provide, for example, a light source that operates in conjunction with the camera module 105. The light emitting element 106 may include, for example, an LED, an IR LED, and a xenon lamp.

The connector holes 108 and 109 may include the first connector hole 108 in which a connector (e.g., a USB connector) for transmitting and receiving power and/or data with an external electronic device is received, and/or the second connector hole 109 (e.g., an earphone jack) in which a connector for transmitting and receiving audio signals with an external electronic device is received.

Figure 3:
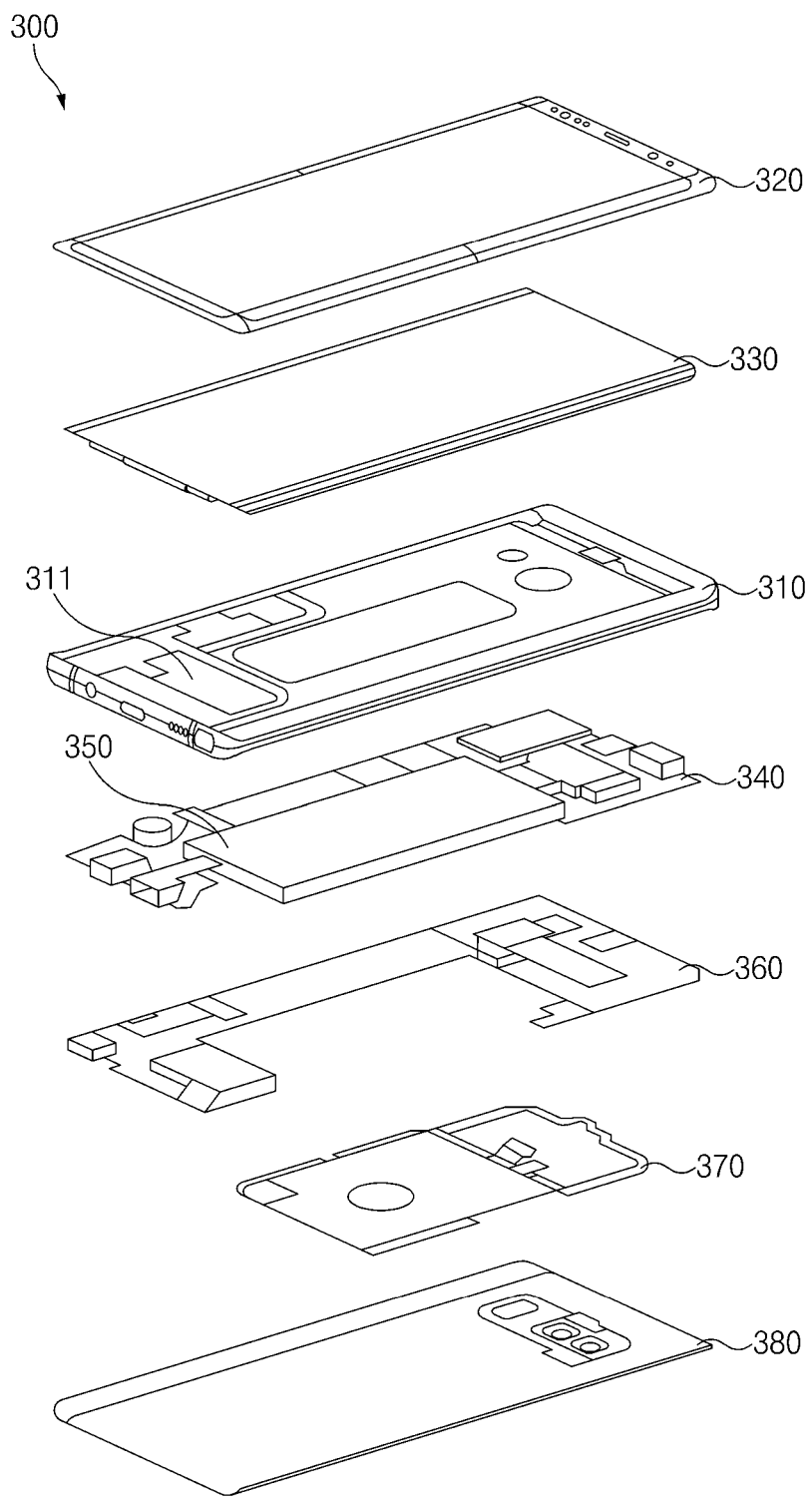
FIG. 3 illustrates an exploded perspective view of the electronic device of FIG. 1.

Referring to FIG. 3, an electronic device 300 may include a side bezel structure 310, a first support member 311 (e.g., a bracket), a front plate 320, a display 330, a printed circuit board 340, a battery 350, a second support member 360 (e.g., a rear case), an antenna 370, and a back plate 380. In some embodiments, the electronic device 300 may omit at least one component (e.g., the first support member 311 or the second support member 360) among the aforementioned components, or may additionally include other component (s). At least one of the components of the electronic device 300 may be the same as, or similar to, at least one of the components of the electronic device 100 of FIG. 1 or FIG. 2, and repetitive descriptions will hereinafter be omitted.

The first support member 311 may be disposed in the electronic device 300 and may be connected with the side bezel structure 310, or may be integrally formed with the side bezel structure 310. The first support member 311 may be formed of, for example, a metallic material and/or a nonmetallic (e.g., polymer) material. The first support member 311 may have one surface to which the display 330 is coupled and an opposite surface to which the printed circuit board 340 is coupled. The printed circuit board 340 may have a processor, a memory, and/or an interface mounted thereon. The processor may include one or more of, for example, a central processing unit, an application processor, a graphic processing unit, an image signal processor, a sensor hub processor, or a communication processor.

The memory may include, for example, a volatile memory or a nonvolatile memory.

The interface may include, for example, a high definition multimedia interface (HDMI), a universal serial bus (USB) interface, an SD card interface, and/or an audio interface. The interface, for example, may electrically or physically connect the electronic device 300 with an external electronic device and may include a USB connector, an SD card/MNIC connector, or an audio connector.

The battery 350 may be a device for supplying power to at least one component of the electronic device 300 and may include, for example, a primary cell that is not rechargeable, a secondary cell that is rechargeable, or a fuel cell. For example, at least part of the battery 350 may be disposed on substantially the same plane as the printed circuit board 340. The battery 350 may be integrally disposed in the electronic device 300 and may be disposed so as to be detachable from the electronic device 300.

The antenna 370 may be disposed between the back plate 380 and the battery 350. The antenna 370 may include, for example, a near field communication (NFC) antenna, a wireless charging antenna, and/or a magnetic secure transmission (MST) antenna. For example, the antenna 370 may perform short range communication with an external device, or may wirelessly transmit and receive power used for charging. In an embodiment, an antenna structure may be formed by the side bezel structure 310 and/or part of the first support member 311, or a combination thereof.

Figure 4:
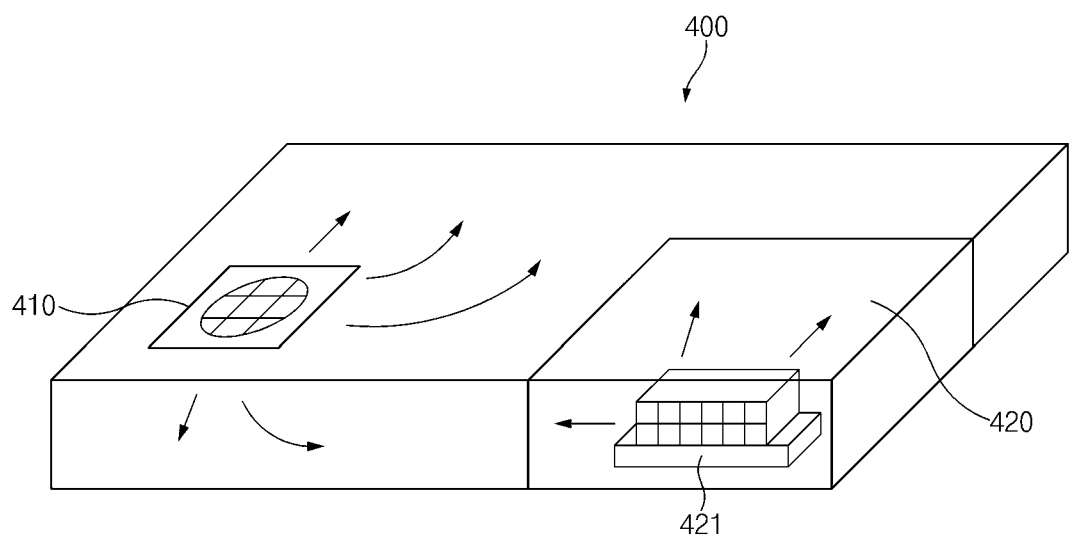
FIG. 4 is a view illustrating an electronic device including sound output devices according to an embodiment.

FIG. 4 is a view 400 illustrating an electronic device (e.g., the electronic device 100 of FIG. 1) that includes sound output devices 410 and 421 according to an embodiment.

In an embodiment, the electronic device 100 may have the sound output devices 410 and 421 mounted therein. The sound output devices 410 and 421 may be referred to as the sound parts. When the sound output devices 410 and 421 are operated or played, air in the sound output devices 410 and 421 and the electronic device 100 may be vibrated by output sounds. When the air in the electronic device 100 vibrates, electrical components in the electronic device 100 may vibrate.

In an embodiment, the sound output devices 410 and 421 may be dynamic speakers. When the dynamic speakers are played, vibration of air may be transmitted to the interior of the electronic device 100, which is a mounting portion on the opposite side to sound outlets, due to vertical motion of vibration plates of the dynamic speakers. The exterior of the product may be shaken due to the vibration of air that is generated in the interior space of the electronic device 100. Furthermore, when the dynamic speakers make loud sounds or make sounds at high output levels, a low-stiffness portion of the electronic device 100 or an electrical component may be intensively vibrated.

In an embodiment, the sound output devices 410 and 421 may be separately modularized and implemented as sound modules 420. However, a compact electronic device, or an electronic device including complex technologies may lack a space for mounting the sound modules 420 implemented by modularizing the sound output devices 410 and 421. Furthermore, in the case where the dynamic speakers are modularized in a small size, the performance may be degraded due to the compression resistance of air in the sound modules 420.

In an embodiment, the electronic device 100 may be designed to release, to the outside, vibration of air that is generated in the sound output devices 410 and 421. When an air flow generated in the dynamic speakers is released outside the electronic device 100, vibration generated in the electronic device 100 may be reduced. However, in the case of the electronic device 100 that fails to rapidly reach pressure equilibrium between the inside and the outside of the electronic device 100 due to design of a waterproof structure, an air flow may be restricted, and therefore vibration reduction may not be easy.

In an embodiment, to prevent vibration of the electrical component, the electrical component that vibrates may be fixed by a fixing member having a force stronger than the vibration force. For example, vibration may be reduced by fixing a vibrating area in the electronic device 100 with a fixing member, such as a tape or sponge, or by strengthening the material stiffness of the electronic device 100. However, it may be difficult to relocate the fixing member, and the thickness of the electronic device 100 may be increased.

Figure 5A:
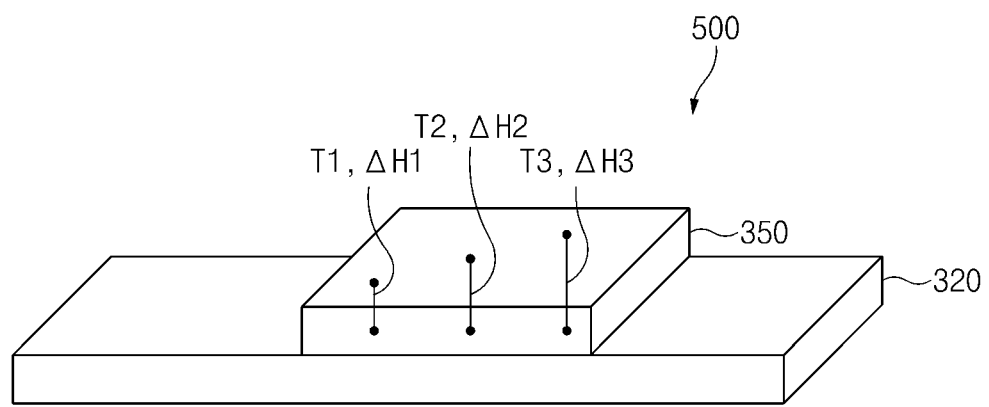
FIG. 5A is a view illustrating a front plate to which an electrical component having a variable thickness is coupled according to an embodiment.
Figure 5B:
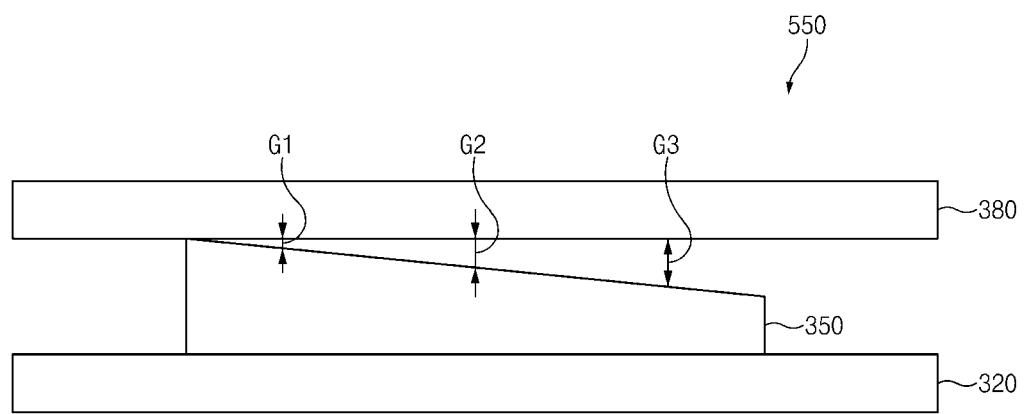
FIG. 5B is a view illustrating the front plate and a back plate to which the electrical component having a variable thickness is coupled according to an embodiment.

FIG. 5A is a view 500 illustrating the front plate 320 to which the electrical component 350 having a variable thickness is coupled according to an embodiment. FIG. 5B is a view 550 illustrating the front plate 320 and the back plate 380 to which the electrical component 350 having a variable thickness is coupled according to an embodiment.

In an embodiment, the electrical component 350 may have a greater variation in thickness than other components in the electronic device. The electrical component 350 may have a specified thickness tolerance or more. The thickness of the electrical component 350 may vary depending on a usage status and/or a usage condition of the electronic device.

In an embodiment, the electrical component 350 may be the battery 350. The thickness of the battery 350 may vary depending on a charging status. When the amount of charge of the battery 350 increases, the thickness of the battery 350 may increase, and when the amount of charge of the battery 350 decreases, the thickness of the battery 350 may decrease. For example, depending on the amount of charge of the battery 350, the thickness of the battery 350 may have a greater variation than a fixing member (e.g., a tape or sponge) of the battery 350.

In an embodiment, depending on the internal structure, the thicknesses of the battery 350 may be different for respective positions, and thickness variations may also be different. For example, referring to FIG. 5A, the left portion of the battery 350 may have a first thickness T1, and the thickness of the left portion may increase by a first variation ΔH1 during charging, compared with during discharging. In another example, the central portion of the battery 350 may have a second thickness T2 greater than the first thickness T1, and the thickness of the central portion may increase by a second variation ΔH2 greater than the first variation ΔH1 during charging, compared with during discharging. In another example, the right portion of the battery 350 may have a third thickness T3 greater than the second thickness T2, and the thickness of the right portion may increase by a third variation ΔH3 greater than the second variation ΔH2 during charging, compared with during discharging.

In an embodiment, the thickness or gap of a variable space formed between the battery 350 and the back plate 380 may also vary depending on the thickness of the battery 350. In the case where the thicknesses of the battery 350 are different for respective positions, the thicknesses of the variable space may also be different for the respective positions. For example, referring to FIG. 5B, the left portion of the back plate 380 may have a first gap G1, the central portion of the back plate 380 may have a second gap G2, and the right portion of the back plate 380 may have a third gap G3.

Because the thickness of the battery 350 varies depending on the thickness tolerance and the charging status, it may not be easy to fix the battery 350 that is vibrated by a sound output device. The battery 350 is characterized in that the thickness tolerance is large depending on the structure of the battery 350 and the thickness varies depending on the charging status, and therefore it may not be easy to design a structure for reducing vibration.

A problem may be encountered when the fixing member is disposed to overlap the battery 350 by a specified thickness. For example, in the case where a thin fixing member is disposed based on a large thickness caused by a large amount of charge of the battery 350 so as to prevent a thickness variation of the electronic device, vibration may be decreased when the battery 350 has a large thickness, but vibration may occur due to the gap of the variable space between the battery 350 and the back plate 380 in the electronic device when the battery 350 has a small thickness due to a small amount of charge of the battery 350. In another example, in the case where a thick fixing member is disposed based on a small thickness caused by a small amount of charge of the battery 350 so as to remove an inner gap, vibration may be decreased even when the battery 350 has a small thickness, but expansion pressure may be generated in the housing of the electronic product to cause the housing to be unfastened or inflated when the battery 350 has a large thickness.

Hereinafter, methods for reducing vibration of the electrical component in a playback condition of a sound output device will be described with reference to FIG. 6 and the following drawings. In particular, structures for reducing vibration of the electrical component, the thickness of which varies depending on a usage status or a usage condition, will be presented.

Figure 6:
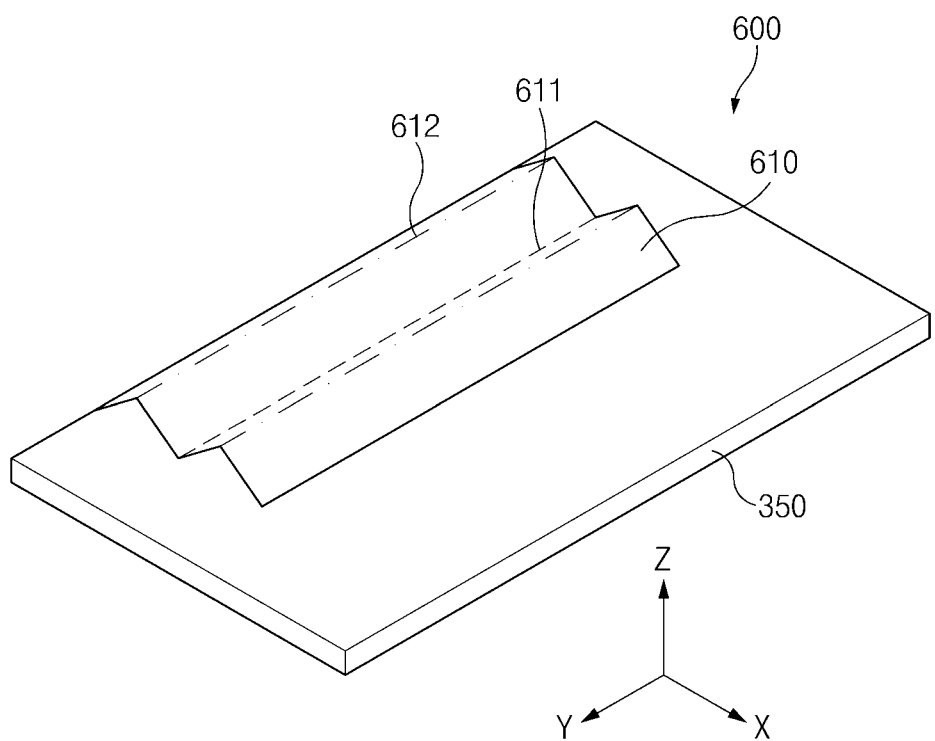
FIG. 6 is a view illustrating the electrical component and a vibration damping member according to an embodiment.

FIG. 6 is a view 600 illustrating the electrical component and a vibration damping member 610 according to an embodiment. FIG. 6 illustrates an example that the electrical component is the battery 350. Without being limited thereto, however, the electrical component may be a component that has a thickness varying depending on a usage status or a usage condition and that is provided in the variable space of the electronic device.

In an embodiment, the vibration damping member 610 may be disposed on one side of the battery 350. The vibration damping member 610 may divide the variable space between the battery 350, which is subject to vibration, and the back plate (e.g., the back plate 380 of FIG. 5B) into a plurality of sub-spaces. The vibration damping member 610 may divide air contained in the variable space between the battery 350 and the back plate 380, the air being a medium for transmitting vibration. The vibration damping member 610 may reduce vibration caused by the battery 350 and the back plate 380.

In an embodiment, depending on the thickness of the variable space formed in the electronic device (e.g., the electronic device 300), the vibration damping member 610 may divide the variable space, or may not divide the variable space. The vibration damping member 610 may have a variable sheet structure capable of selectively dividing the variable space depending on a variation in the variable space.

In an embodiment, the vibration damping member 610 may have a plurality of folds 611 and 612 that cause the vibration damping member 610 to be folded or bent in the variable space. Folding directions may be preset by the plurality of folds 611 and 612. Depending on the folding directions of the folds 611 and 612, the vibration damping member 610 may be folded toward, or away from, the battery 350.

In an embodiment, the plurality of folds 611 and 612 may include the first folds 611 and the second folds 612. The first folds 611 may cause the vibration damping member 610 to be folded to protrude in a first direction (e.g., a first direction D1 of FIG. 7A) toward the first surface in the variable space. The second folds 612 may cause the vibration damping member 610 to be folded to protrude in a second direction (e.g., a second direction D2 of FIG. 7A) that is opposite to the first direction D1.

In an embodiment, the first folds 611 and the second folds 612 may be alternately disposed on the vibration damping member 610. The first folds 611 and the second folds 612 may be alternately disposed such that the folding directions of folds adjacent to each other are different from each other.

In an embodiment, the vibration damping member 610 may divide the volume of air in the variable space that is a medium for transmitting vibration. When the variable space has a specified thickness or more, the vibration damping member 610 may divide the variable space into a plurality of sub-spaces. When the thickness of the variable space is less than the specified thickness, the vibration damping member 610 may be unfolded so as not to substantially occupy a volume. When the thickness of the variable space is less than the specified thickness, the vibration damping member 610 may prevent the back plate 380 from being pushed rearward, or may prevent pressure from being applied to the portion on which the battery 350 is mounted.

Figure 7A:
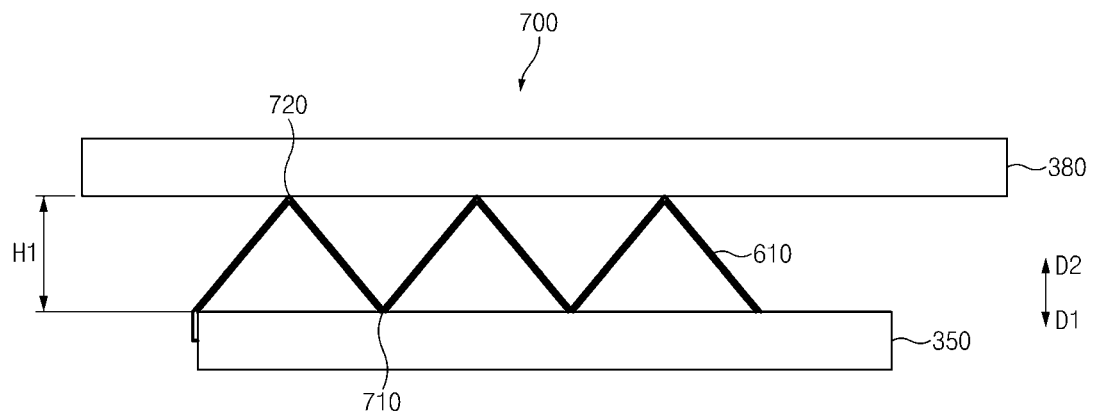
FIG. 7A is a view illustrating the electrical component and a vibration damping member according to an embodiment.
Figure 7B:
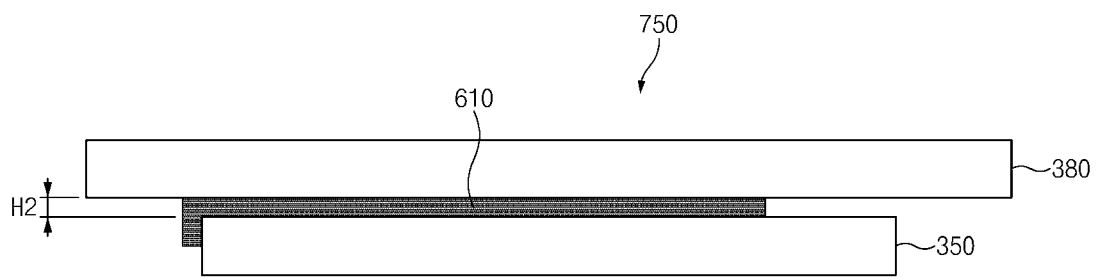
FIG. 7B is a view illustrating the electrical component and the vibration damping member according to an embodiment.

FIG. 7A is a view 700 illustrating the electrical component (e.g., the battery 350) and the vibration damping member 610 according to an embodiment. FIG. 7B is a view 750 illustrating the electrical component 350 and the vibration damping member 610 according to an embodiment.

In an embodiment, the electrical component 350 may be disposed in the housing. The electrical component 350 may have a thickness varying depending on a usage status or a usage condition.

In an embodiment, the vibration damping member 610 may be disposed on at least part of the electrical component 350. The vibration damping member 610 may be disposed on one surface of the electrical component 350. The vibration damping member 610 may be disposed in the variable space formed by the electrical component 350 and the back plate 380. The vibration damping member 610 may be disposed such that at least part thereof makes contact with the electrical component 350 and the back plate 380.

In an embodiment, the vibration damping member 610 may have a height varying in the thickness direction of the variable space to correspond to the thickness of the variable space formed by the electrical component 350 and the back plate 380. For example, in FIG. 7A, the vibration damping member 610 may vary in height to have a first height H1 that is the same as the thickness of the variable space. In another example, in FIG. 7B, the vibration damping member 610 may vary in height to have a second height H2 that is the same as the thickness of the variable space.

In an embodiment, when the variable space has a specified thickness or more, the vibration damping member 610 may divide the variable space into a plurality of sub-spaces. For example, when the variable space has the first height H1 that is greater than or equal to the specified thickness, the vibration damping member 610 may divide the variable space into the plurality of sub-spaces.

In an embodiment, the vibration damping member 610 may have first protrusions 710 and second protrusions 720. The first protrusions 710 may protrude in the first direction D1. The first protrusions 710 may make contact with the electrical component 350. The second protrusions 720 may protrude in the second direction D2. The second protrusions 720 may make contact with the back plate 380.

In an embodiment, the height difference between the first protrusions 710 and the second protrusions 720 may be substantially the same as the thickness of the variable space. For example, in FIG. 7A, the height of the first protrusions 710 in the first direction D1 and the height of the second protrusions 720 in the second direction D2 may be substantially the same as the first height H1.

In an embodiment, when the variable space has the specified thickness or more, the vibration damping member 610 may divide the variable space into the plurality of sub-spaces while being folded along a plurality of folds (e.g., the first folds 611 and the second folds 612 of FIG. 6). For example, as illustrated in FIG. 7A, when the variable space has the first height H1 that is greater than or equal to the specified thickness, the vibration damping member 610 may divide the variable space in a triangular-wave form while being folded along the plurality of folds 611 and 612.

In an embodiment, when the variable space has the specified thickness or more, the vibration damping member 610 may divide the variable space into the plurality of sub-spaces while making contact with the electrical component 350 and the back plate 380 at a plurality of points. For example, as illustrated in FIG. 7A, when the variable space has the first height H1 that is greater than or equal to the specified thickness, the vibration damping member 610 may divide the variable space in a triangular-wave form while making contact with the electrical component 350 and the back plate 380 at the plurality of points alternating with one another.

In an embodiment, the thickness of the variable space may vary complementarily to a thickness variation of the electrical component 350. A thickness variation of the variable space may be greater than the thickness of the vibration damping member 610. The vibration damping member 610 may cope with the thickness variation of the variable space while changing the form using the plurality of folds 611 and 612.

In an embodiment, when the thickness of the variable space is less than the specified thickness, the vibration damping member 610 may be disposed to make surface-to-surface contact with the electrical component 350 and the back plate 380. For example, as illustrated in FIG. 7B, when the variable space has the second height H2 that is less than the specified thickness, the vibration damping member 610 may be disposed in a plate form to make surface-to-surface contact with both the electrical component 350 and the back plate 380.

In an embodiment, when the thickness of the variable space is less than the specified thickness, the vibration damping member 610 may be unfolded using the plurality of folds 611 and 612. The plurality of folds 611 and 612 may cause the vibration damping member 610 to be unfolded between the electrical component 350 and the back plate 380.

In an embodiment, when the thickness of the variable space is less than the specified thickness, the vibration damping member 610 may be disposed to entirely make contact with the electrical component 350 and the back plate 380. The vibration damping member 610 may be disposed so as not to substantially occupy a volume in the variable space.

In an embodiment, the vibration damping member 610 may be deformed to have different heights so as to correspond to the thicknesses of the variable space for respective areas. For example, the thickness of the electrical component 350 may be non-uniformly varied, and therefore the variable space may have a thickness corresponding to the first height H1 in one area and a thickness corresponding to the second height H2 in the remaining area. In this case, in the one area, the vibration damping member 610 may have the first height H1 and may divide the variable space into a plurality of sub-spaces, and in the remaining area, the vibration damping member 610 may have the second height H2 and may be deformed into a flat state.

Figure 8:
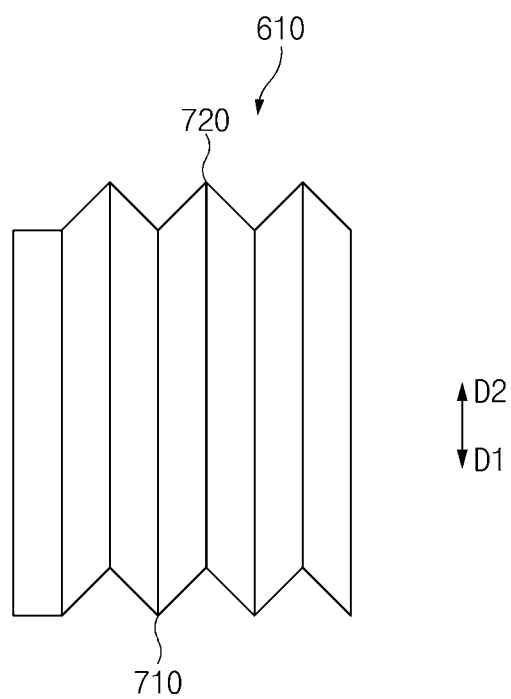
FIG. 8 is a view illustrating a vibration damping member according to an embodiment.

FIG. 8 is a view illustrating the vibration damping member 610 according to an embodiment.

In an embodiment, the vibration damping member 610 may have the first protrusions 710 and the second protrusions 720. The first protrusions 710 and the second protrusions 720 may protrude in opposite directions. For example, the first protrusions 710 may be disposed to protrude in the first direction D1 toward the electrical component (e.g., the battery 350 of FIG. 7A) in the variable space, and the second protrusions 720 may be disposed to protrude in the second direction D2 opposite to the first direction D1. The vibration damping member 610 may have a plurality of folds (e.g., the first folds 611 and the second folds 612 of FIG. 6) for forming the first protrusions 710 and the second protrusions 720. The plurality of folds 611 and 612 may have restoring power to fill the variable space between the electrical component (e.g., the electrical component 350 of FIG. 7A) and the back plate (e.g., the back plate 380 of FIG. 7A).

In an embodiment, the vibration damping member 610 may have a form that is bent in a triangular-wave form. The vibration damping member 610 may have a zigzag form in the first direction D1 and the second direction D2. The vibration damping member 610 may divide the variable space adjacent to the vibration damping member 610 in a triangular-wave form.

In an embodiment, the vibration damping member 610 may have different forms in at least a partial area. The length of the vibration damping member 610 in the first direction D1 may partially vary to correspond to a thickness variation of the electrical component 350. For example, when the thickness of the variable space decreases in a partial area in which the electrical component 350 has a large thickness, the vibration damping member 610 may decrease the degree to which the first protrusions 710 and the second protrusions 720 protrude in the partial area. In another example, when the thickness of the variable space increases in a partial area in which the electrical component 350 has a small thickness, the vibration damping member 610 may increase the degree to which the first protrusions 710 and the second protrusions 720 protrude in the partial area.

Figure 9A:
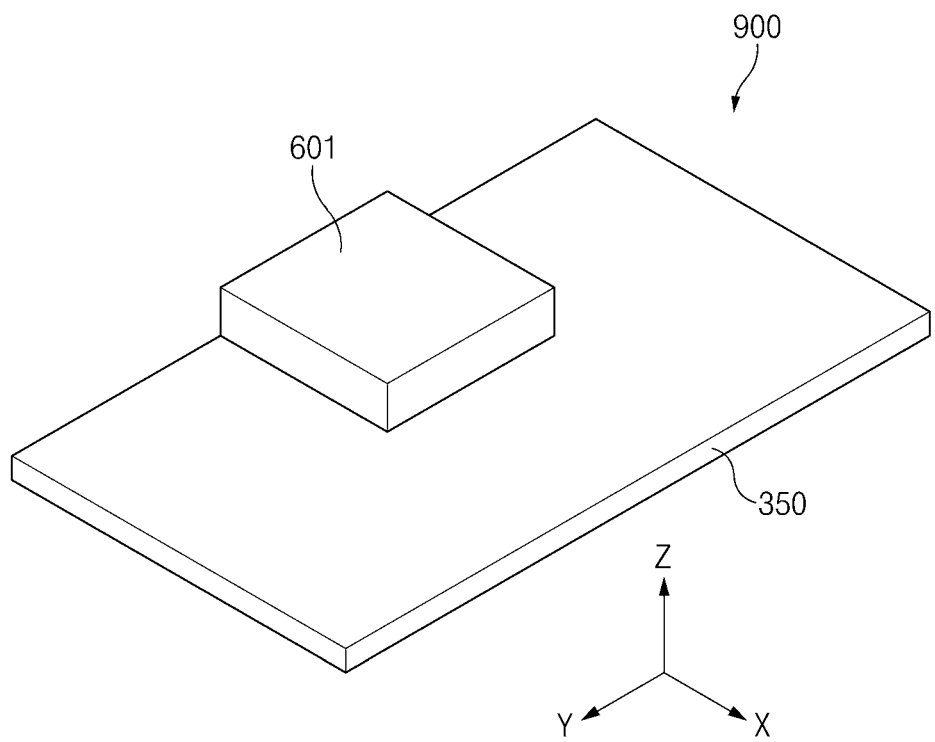
FIG. 9A is a view illustrating vibration formed in a variable space by a conventional fixing member.
Figure 9A:
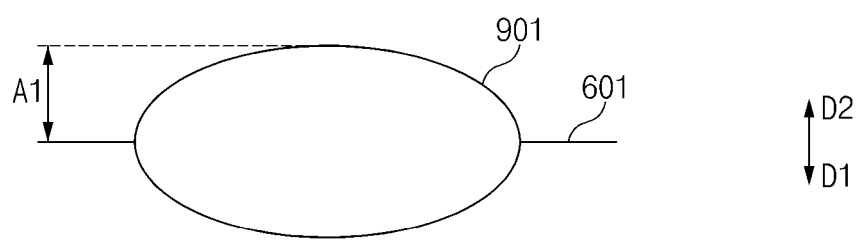

FIG. 9A is a view 900 illustrating vibration formed in a variable space 901 by a conventional fixing member 601.

The conventional fixing member 601 may be integrally disposed on the electrical component 350. The variable space 901 may be left undivided by the fixing member 601. When sound output devices (e.g., the sound output devices 410 and 421 of FIG. 4) output sounds, the variable space 901 formed by the fixing member 601 may integrally vibrate. The variable space 901, when integrally vibrating, may transmit vibrations generated from the sound output devices with a first amplitude A1.

Figure 9B:
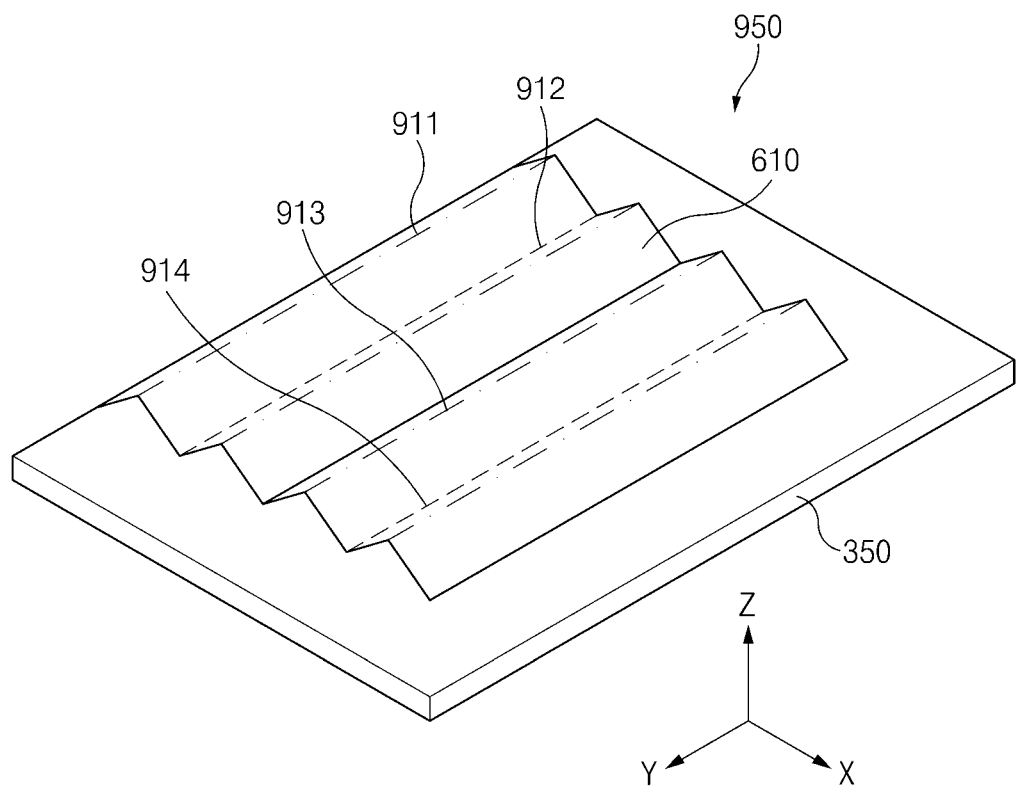
FIG. 9B is a view illustrating vibrations in a plurality of sub-spaces formed by a vibration damping member according to an embodiment.
Figure 9B:
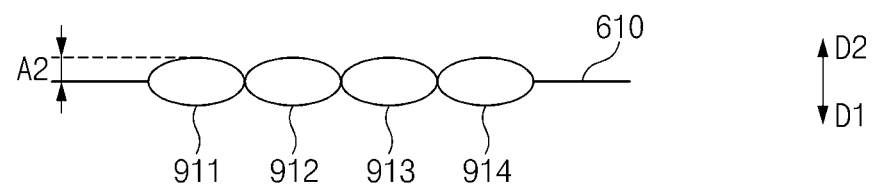

FIG. 9B is a view 950 illustrating vibrations in a plurality of sub-spaces 911, 912, 913, and 914 formed by the vibration damping member 610 according to an embodiment.

In an embodiment, at least part of the vibration damping member 610 may be disposed on the electrical component 350. The vibration damping member 610 may divide the variable space (e.g., the variable space 901 of FIG. 9A) using the plurality of folds 611 and 612 to form the plurality of sub-spaces 911, 912, 913, and 914. For example, the vibration damping member 610 may form the first to fourth sub-spaces 911, 912, 913, and 914 using the first and second folds 611 and 612. When the sound output devices 410 and 421 output sounds, the first to fourth sub-spaces 911, 912, 913, and 9124 formed by the vibration damping member 610 may vibrate in the divided state. The first to fourth sub-spaces 911, 912, 913, and 914, when vibrating in the divided state, may transmit the vibrations with a second amplitude A2 smaller than the first amplitude (e.g., the first amplitude A1 of FIG. 9A).

Figure 10A:
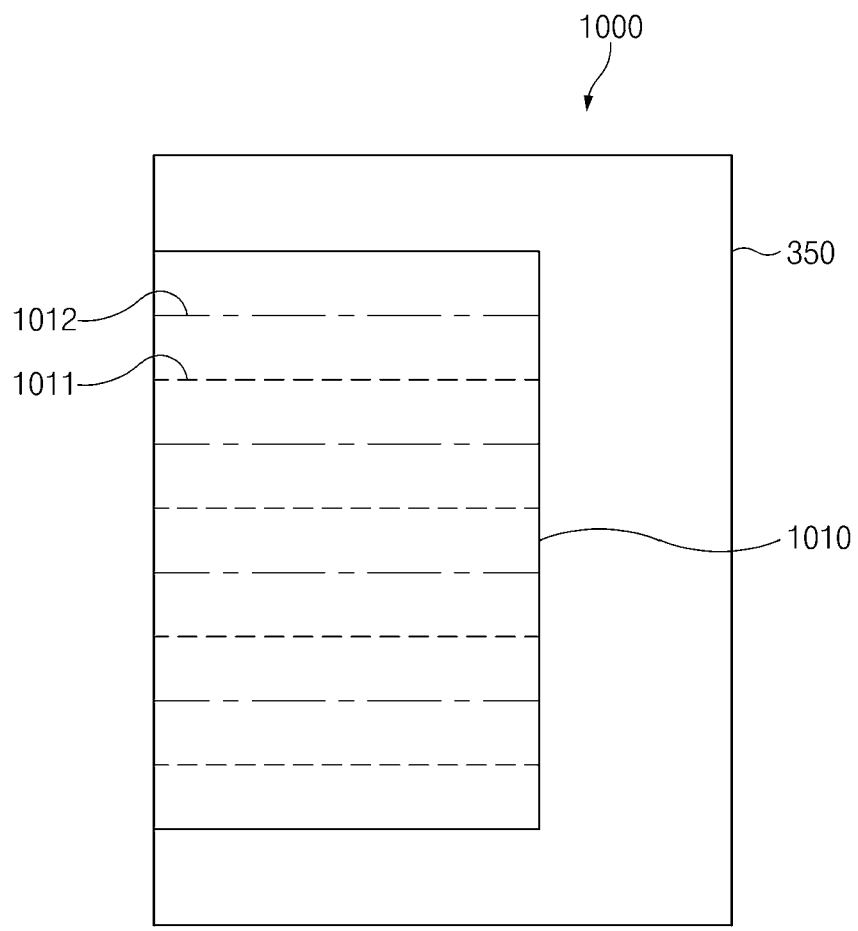
FIG. 10A is a view illustrating a vibration damping member according to an embodiment.
Figure 10B:
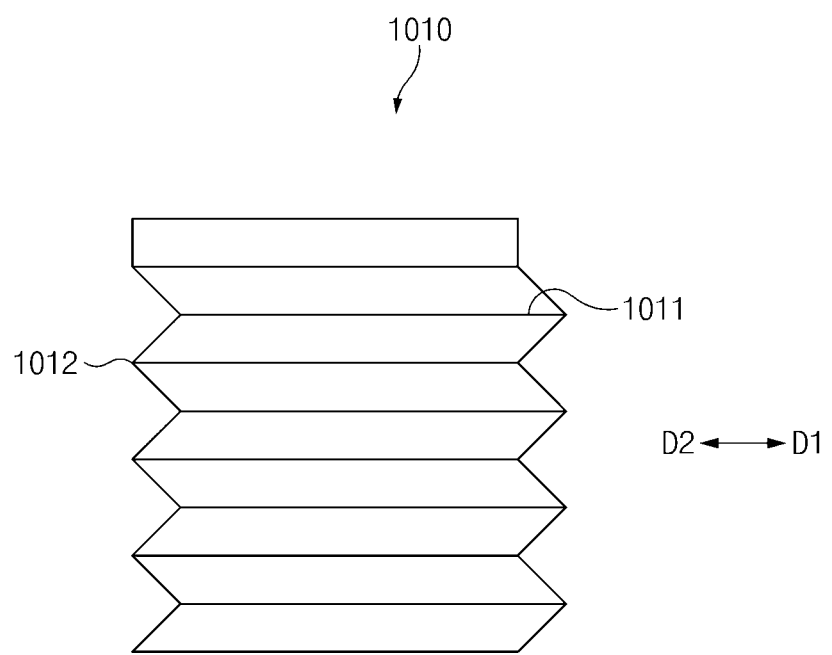
FIG. 10B is a view illustrating a folded state of the vibration damping member according to an embodiment.

FIG. 10A is a view 1000 illustrating a vibration damping member 1010 according to an embodiment. FIG. 10B is a view illustrating a folded state of the vibration damping member 1010 according to an embodiment.

In an embodiment, the vibration damping member 1010 may have a plurality of folds 1011 and 1012. The plurality of folds 1011 and 1012 may be formed in a direction different from that of the plurality of folds 611 and 612 of FIG. 6. For example, as illustrated in FIG. 10A, the plurality of folds 1011 and 1012 may be formed in the direction toward the left side and/or the right side of the vibration damping member 1010.

In an embodiment, the plurality of folds 1011 and 1012 may cause the vibration damping member 1010 to be folded. The plurality of folds 1011 and 1012 may cause the vibration damping member 1010 to at least partially protrude in the first direction D1 or the second direction D2. The plurality of folds 1011 and 1012 may cause the vibration damping member 1010 to be bent in a zigzag form.

Figure 10C:
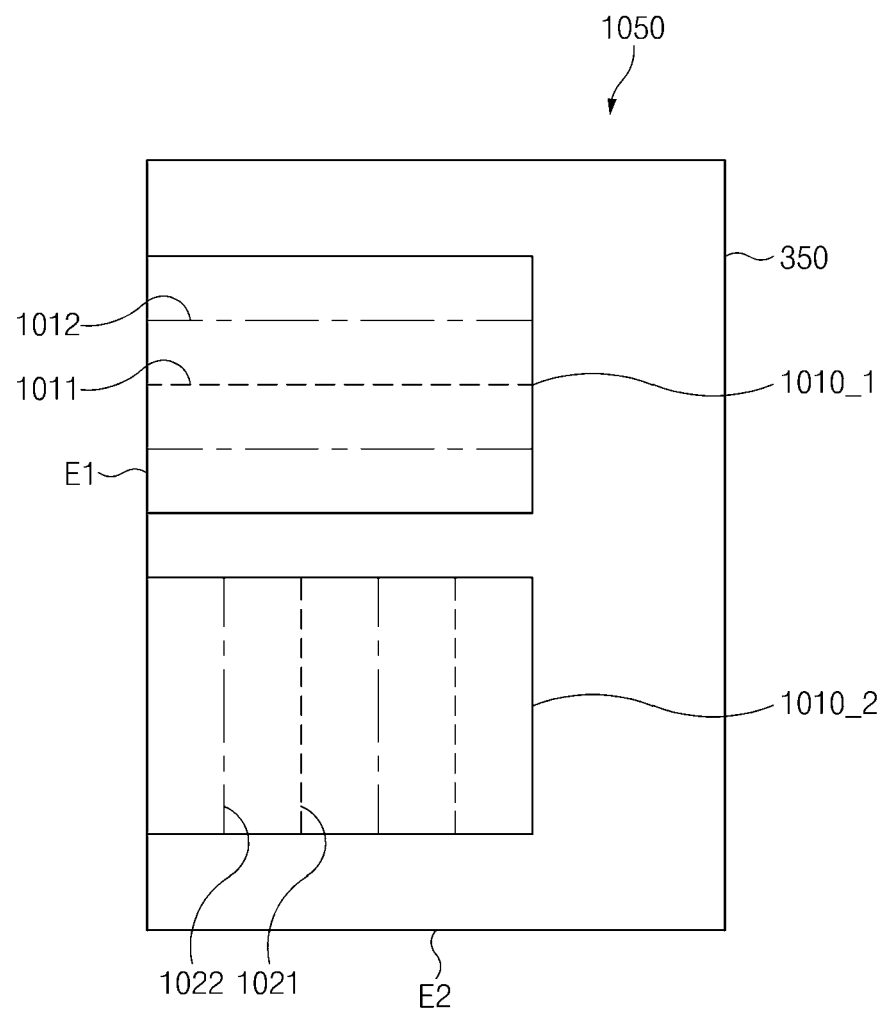
FIG. 10C is a view illustrating a state in which a plurality of vibration damping members according to an embodiment are disposed on the electrical component.

FIG. 10C is a view 1050 illustrating a state in which a plurality of vibration damping members 1010_1 and 1010_2 according to an embodiment are disposed on the electrical component 350.

In an embodiment, the plurality of vibration damping members 1010_1 and 1010_2 may be disposed on the electrical component 350. For example, the first and second vibration damping members 1010_1 and 1010_2 may be disposed on the electrical component 350. The first and second vibration damping members 1010_1 and 1010_2 may be substantially the same as the vibration damping member 1010 of FIG. 10A. The first and second vibration damping members 1010_1 and 1010_2 may be spaced apart from each other. The first and second vibration damping members 1010_1 and 1010_2 may be disposed adjacent to each other. A plurality of folds 1011, 1012, 1021, and 1022 may be disposed on the first and second vibration damping members 1010_1 and 1010_2.

In an embodiment, among the plurality of folds 1011, 1012, 1021, and 1022, at least some folds 1011 and 1012 may be disposed to face toward a first edge E1 among the edges of the electrical component 350, and the remaining folds 1021 and 1022 may be disposed to face toward a second edge E2 that meets the first edge E1. For example, the folds 1011 and 1012 disposed on the first vibration damping member 1010_1 may be disposed to face toward the first edge E1, and the folds 1021 and 1022 disposed on the second vibration damping member 1010_2 may be disposed to face toward the second edge E2. Accordingly, protrusions may be formed in different directions for respective areas of the electrical component 350 to divide the variable space on the electrical component 350.

In FIG. 10C, it is exemplified that the plurality of vibration damping members 1010_1 and 1010_2 are all attached to the electrical component 350. Without being limited thereto, however, the plurality of vibration damping members 1010_1 and 1010_2 may be disposed to overlap each other on the electrical component 350. For example, one vibration damping member 1010_1 may be attached to the electrical component 350, and another vibration damping member 1010_2 may be stacked on and/or attached to the one vibration damping member 1010_1 in a separate sheet form. Even when the vibration damping members 1010_1 and 1010_2 overlap each other, the vibration damping members 1010_1 and 1010_2 may divide the variable space between the electrical component 350 and the back plate (e.g., the back plate 380 of FIG. 7A) into a plurality of sub-spaces. Furthermore, when the vibration damping members 1010_1 and 1010_2 are attached to overlap each other, work efficiency in attaching the vibration damping members 1010_1 and 1010_2 may be improved.

Figure 11A:
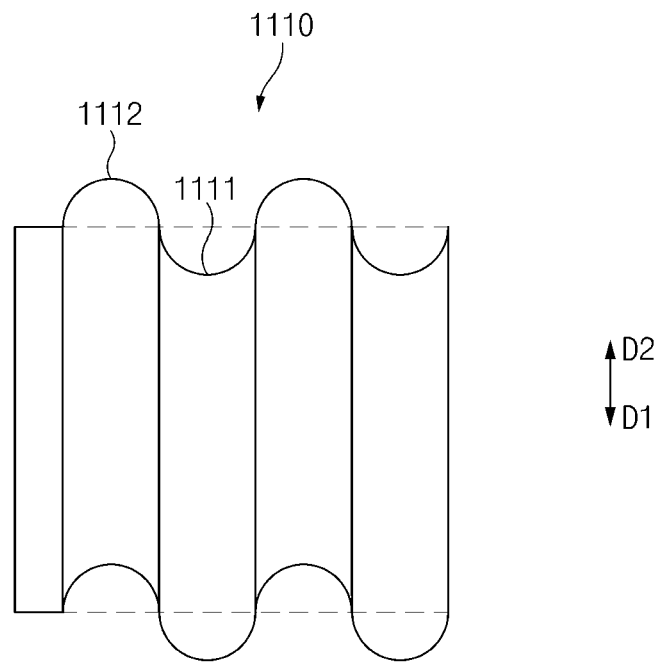
FIG. 11A is a view illustrating a vibration damping member according to an embodiment.

FIG. 11A is a view 1110 illustrating a vibration damping member 1110 according to an embodiment.

In an embodiment, the vibration damping member 1110 may include first curved portions 1111 and second curved portions 1112. The first curved portions 1111 may be convex in the first direction D1 toward the electrical component (e.g., the electrical component 350 of FIG. 10C) in the variable space. The second curved portions 1112 may be convex in the second direction D1 opposite to the first direction D1.

In an embodiment, the heights of the first curved portions 1111 and the second curved portions 1112 may be varied to be substantially the same as the height of the variable space. The heights of the first curved portions 1111 and the second curved portions 1112 may be varied to correspond to the height of the variable space. When the thickness of the variable space increases, the heights of the first curved portions 1111 and the second curved portions 1112 may increase to prevent a gap from being generated. The variable space on the electrical component 350 may be divided into a plurality of sub-spaces by the vibration damping member 1110. When the variable space is divided into the plurality of sub-spaces, vibration intensity may be reduced. Furthermore, when the thickness of the variable space decreases, the heights of the first curved portions 1111 and the second curved portions 1112 may decrease, and the first curved portions 1111 and the second curved portions 1112 may press the electrical component 350 to prevent generation of internal pressure.

In an embodiment, the variable space may be divided depending on the first curved portions 1111 and the second curved portions 1112. When the variable space has a specified thickness or more, the variable space may be divided into a plurality of sub-spaces having the form of a portion of a sinusoidal wave. When vibrations generated from sound output devices (e.g., the sound output devices 410 and 421 of FIG. 4) are transmitted through air in the plurality of sub-spaces into which the first curved portions 1111 and the second curved portions 1112 divide the variable space, vibration of the electrical component 350 may be reduced.

Figure 11B:
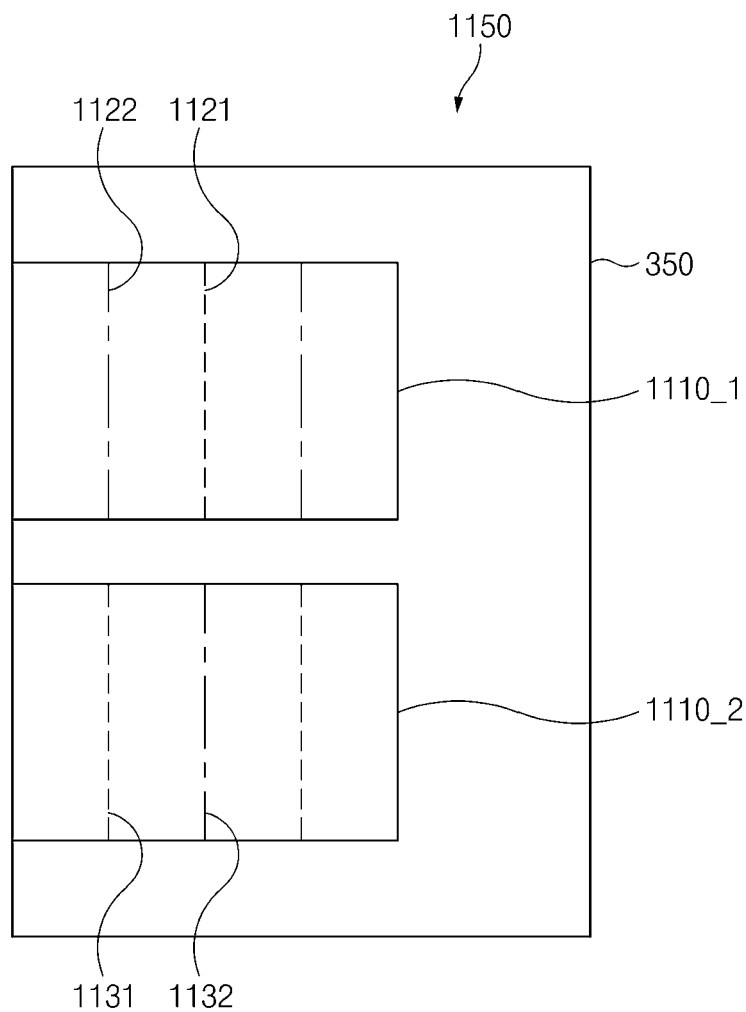
FIG. 11B is a view illustrating a state in which a plurality of vibration damping members according to an embodiment are disposed on the electrical component.

FIG. 11B is a view 1150 illustrating a state in which a plurality of vibration damping members 1110_1 and 1110_2 according to an embodiment are disposed on the electrical component 350.

In an embodiment, the plurality of vibration damping members 1110_1 and 1010_2 may be disposed on the electrical component 350. For example, the third and fourth vibration damping members 1110_1 and 1110_2 may be disposed on the electrical component 350. The third and fourth vibration damping members 1110_1 and 1110_2 may be substantially the same as the vibration damping member 1110 of FIG. 11A. The third and fourth vibration damping members 1110_1 and 1110_2 may be spaced apart from each other. The third and fourth vibration damping members 1110_1 and 1110_2 may be disposed adjacent to each other. A plurality of folds 1121, 1122, 1131, and 1132 may be disposed on the third and fourth vibration damping members 1110_1 and 1110_2.

In an embodiment, the third vibration damping member 1110_1 may include the third folds 1121 and the fourth folds 1122, and the fourth vibration damping member 1110_2 may also include the third folds 1131 and the fourth folds 1132. The third folds 1121 and 1131 may cause the third and fourth vibration damping members 1110_1 and 1110_2 to be convex in the first direction (e.g., the first direction D1 of FIG. 11A) toward the electrical component 350 in the variable space. The fourth folds 1122 and 1132 may cause the third and fourth vibration damping members 1110_1 and 1110_2 to be convex in the second direction D2 opposite to the first direction D1.

In an embodiment, a plurality of third and fourth vibration damping members 1110_1 and 1110_2 may be disposed on the electrical component 350, and the third folds 1121 and 1131 and the fourth folds 1122 and 1132 may be disposed to alternate with one another on the plurality of third and fourth vibration damping members 1110_1 and 1110_2. For example, the third fold 1121 of the third vibration damping member 1110_1 and the fourth fold 1132 of the fourth vibration damping member 1110_2 may be disposed on a straight line, and the fourth fold 1122 of the third vibration damping member 1110_1 and the third fold 1131 of the fourth vibration damping member 1110_2 may be disposed on a straight line.

In an embodiment, the third and fourth vibration damping members 1110_1 and 1110_2 may be substantially the same as one of the vibration damping member 610 of FIG. 8 and the vibration damping member 1110 of FIG. 11A. Accordingly, the third and fourth vibration damping members 1110_1 and 1110_2 may have different forms. For example, the third vibration damping member 1110_1 may be substantially the same as the vibration damping member 610 of FIG. 8 and may have a triangular-wave form with the protrusions 710 and 720, and the fourth vibration damping member 1110_2 may be substantially the same as the vibration damping member 1110 of FIG. 11A and may have a sinusoidal-wave form with the curved portions 1111 and 1112.

Figure 12A:
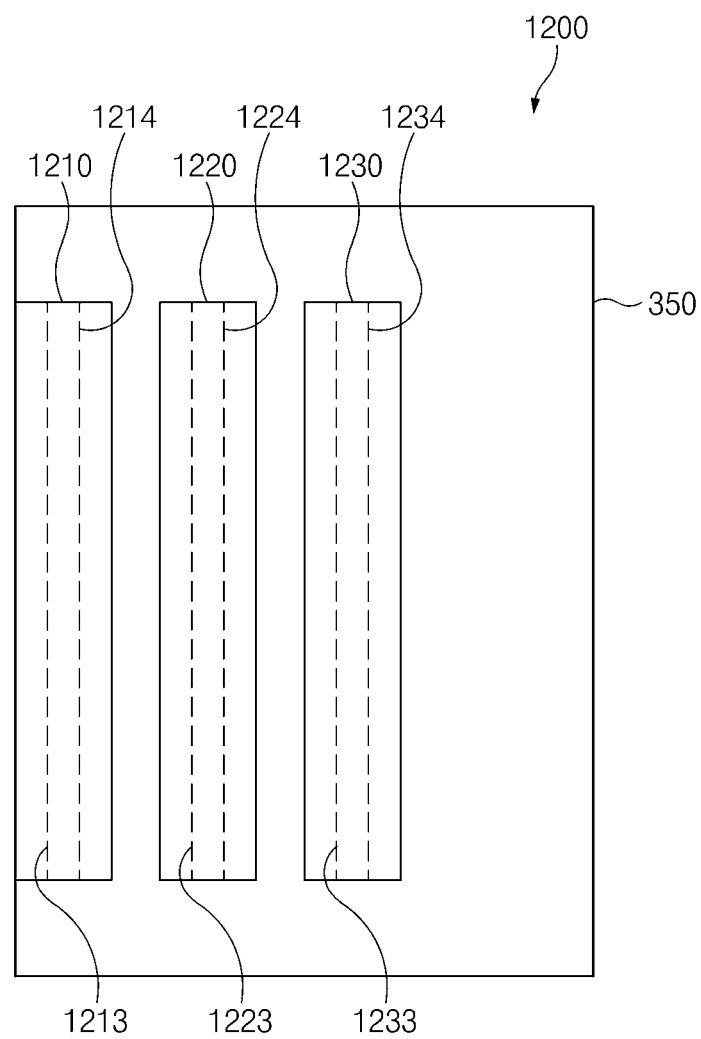
FIG. 12A is a view illustrating a state in which a plurality of expansion parts according to an embodiment are disposed on the electrical component.
Figure 12B:
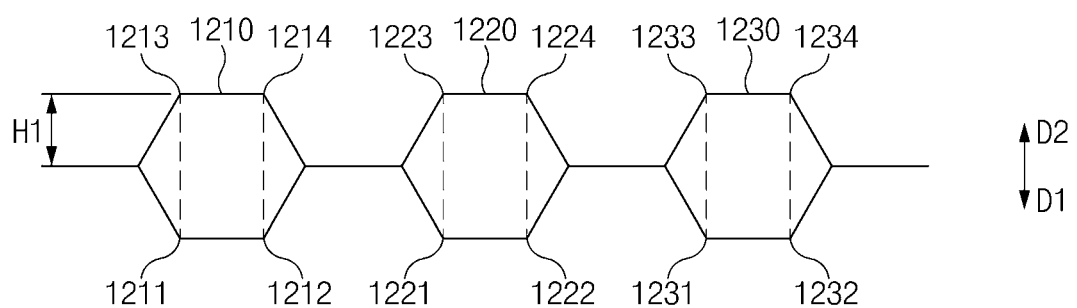
FIG. 12B is a view illustrating the plurality of expansion parts according to an embodiment.
Figure 12C:
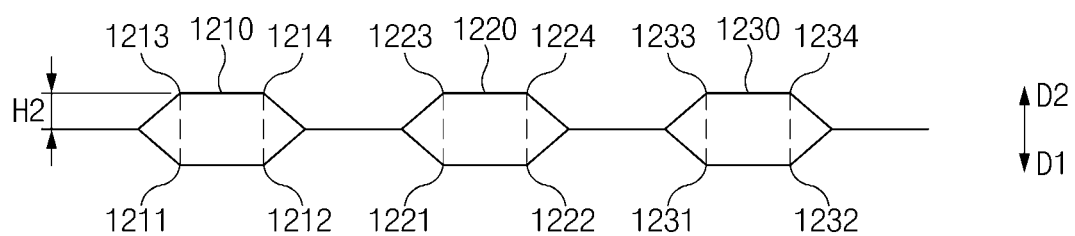
FIG. 12C is a view illustrating the plurality of expansion parts according to an embodiment.
Figure 12D:
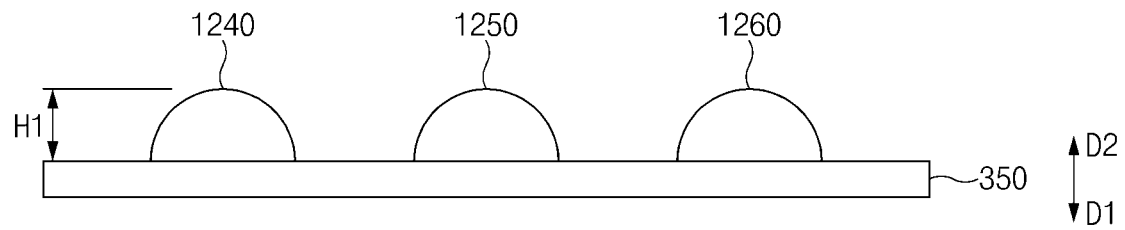
FIG. 12D is a view illustrating a plurality of expansion parts according to an embodiment.
Figure 12E:
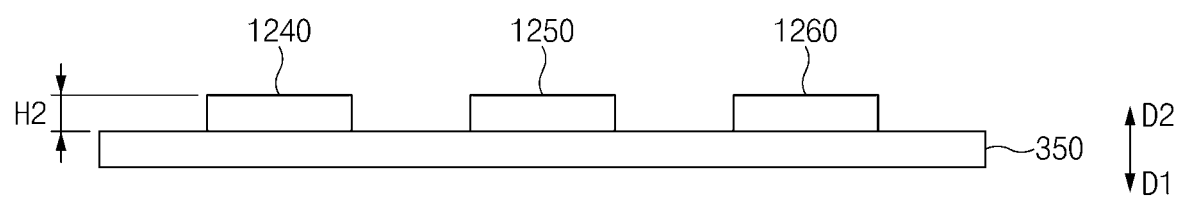
FIG. 12E is a view illustrating a plurality of expansion parts according to an embodiment.

FIG. 12A is a view 1200 illustrating a state in which a plurality of expansion parts 1210, 1220, and 1230 according to an embodiment are disposed on the electrical component 350. FIG. 12B is a view illustrating the plurality of expansion parts 1210, 1220, and 1230 according to an embodiment. FIG. 12C is a view illustrating the plurality of expansion parts 1210, 1220, and 1230 according to an embodiment. FIG. 12D is a view illustrating a plurality of expansion parts 1240, 1250, and 1260 according to an embodiment. FIG. 12E is a view illustrating the plurality of expansion parts 1240, 1250, and 1260 according to an embodiment.

In an embodiment, a vibration damping member may include the plurality of expansion parts 1210, 1220, and 1230. In the variable space, the plurality of expansion parts 1210, 1220, and 1230 may expand in the first direction D1 toward the electrical component 350 and the second direction D2 opposite to the first direction D1. When the thickness of the variable space is increased due to a small thickness of the electrical component 350, the thicknesses of the plurality of expansion parts 1210, 1220, and 1230 may be increased to divide the variable space. When the thickness of the variable space is decreased due to a large thickness of the electrical component 350, the thicknesses of the plurality of expansion parts 1210, 1220, and 1230 may be decreased. The plurality of expansion parts 1210, 1220, and 1230 may have a shape like an air pocket.

In an embodiment, when the thickness of the variable space is decreased due to a large thickness of the electrical component 350, the thicknesses of the plurality of expansion parts 1210, 1220, and 1230 may be decreased, and the plurality of expansion parts 1210, 1220, and 1230 may occupy the variable space between the electrical component 350 and the back plate (e.g., the back plate 380 of FIG. 7A) in a direction perpendicular to the first and second directions D1 and D2.

In an embodiment, the plurality of expansion parts 1210, 1220, and 1230 may expand to have substantially the same height as the thickness of the variable space. For example, as illustrated in FIG. 12B, when the variable space has the first height H1, the plurality of expansion parts 1210, 1220, and 1230 may expand to have the first height H1. In another example, as illustrated in FIG. 12C, when the variable space has the second height H2, the plurality of expansion parts 1210, 1220, and 1230 may expand to have the second height H2. The plurality of expansion parts 1210, 1220, and 1230 may make surface-to-surface contact with the electrical component 350 and the back plate (e.g., the back plate 380 of FIG. 3).

In an embodiment, the plurality of expansion parts 1210, 1220, and 1230 may include a plurality of folds 1211 to 1214, 1221 to 1224, and 1231 to 1234, respectively. The plurality of expansion parts 1210, 1220, and 1230 may expand or contract to a height corresponding to the variable space by using the plurality of folds 1211 to 1214, 1221 to 1224, and 1231 to 1234.

In an embodiment, the plurality of expansion parts 1210, 1220, and 1230 may include the fifth folds 1211, 1212, 1221, 1222, 1231, and 1232 and the sixth folds 1213, 1214, 1223, 1224, 1233, and 1234, respectively. The fifth folds 1211, 1212, 1221, 1222, 1231, and 1232 may cause the vibration damping member including the plurality of expansion parts 1210, 1220, and 1230 to expand in the first direction D1 toward the electrical component 350 in the variable space. The sixth folds 1213, 1214, 1223, 1224, 1233, and 1234 may cause the vibration damping member including the plurality of expansion parts 1210, 1220, and 1230 to expand in the second direction D2 opposite to the first direction D1.

In an embodiment, the fifth folds 1211, 1212, 1221, 1222, 1231, and 1232 and the sixth folds 1213, 1214, 1223, 1224, 1233, and 1234 may be disposed to overlap each other in the first direction D1 on the vibration damping member including the plurality of expansion parts 1210, 1220, and 1230. For example, the fifth folds 1211 and 1212 included in the first expansion part 1210 among the plurality of expansion parts 1210, 1220, and 1230 may overlap the sixth folds 1213 and 1214 included in the first expansion part 1210 in the first direction D1.

In an embodiment, as illustrated in FIGS. 12B and 12C, the plurality of expansion parts 1210, 1220, and 1230 may expand or contract in a hexagonal form. Without being limited thereto, however, the plurality of expansion parts 1240, 1250, and 1260 may expand or contract in various forms. The plurality of expansion parts 1240, 1250, and 1260 may have a concave shape and may be formed of a flexible material. For example, as illustrated in FIG. 12D, the plurality of expansion parts 1240, 1250, and 1260 may expand in a semi-circular form on the electrical component 350. The plurality of expansion parts 1240, 1250, and 1260 may have the first height H1. In another example, as illustrated in FIG. 12E, the plurality of expansion parts 1240, 1250, and 1260 may expand in a rectangular form on the electrical component 350. The plurality of expansion parts 1240, 1250, and 1260 may have the first height H1.

Figure 13A:
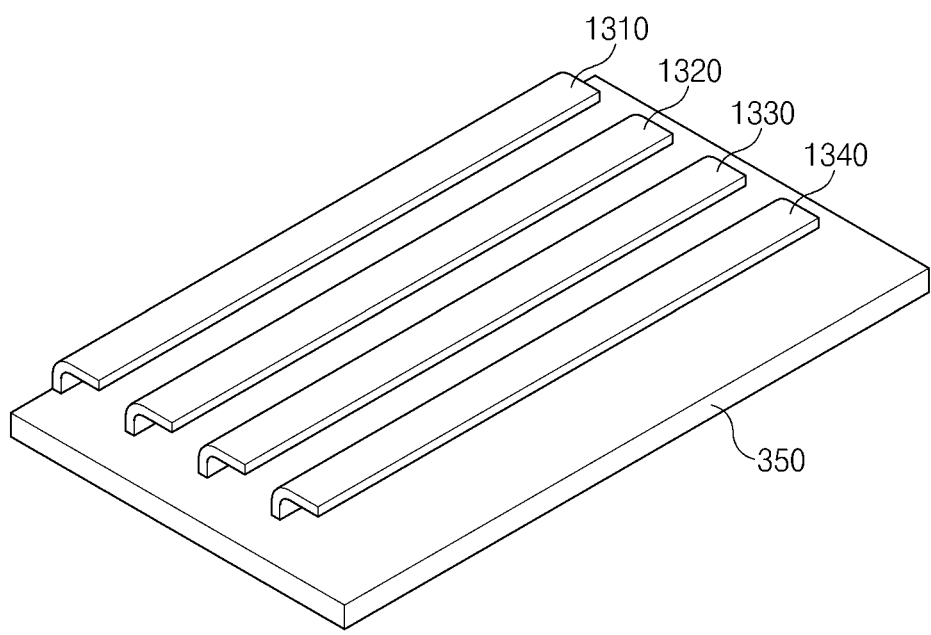
FIG. 13A is a view illustrating a state in which a plurality of directional members according to an embodiment are disposed on the electrical component.
Figure 13B:
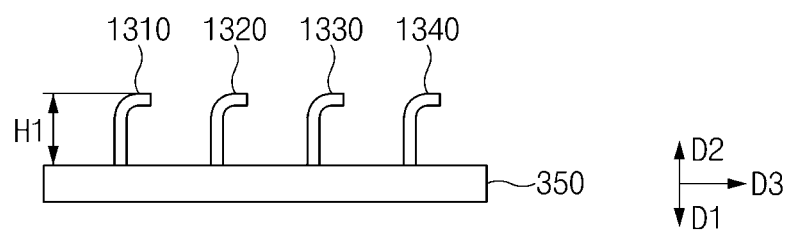
FIG. 13B is a view illustrating the plurality of directional members according to an embodiment.
Figure 13C:
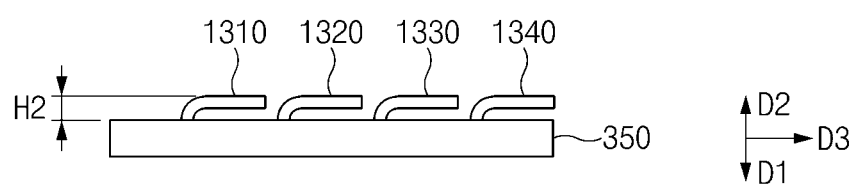
FIG. 13C is a view illustrating the plurality of directional members according to an embodiment.

FIG. 13A is a view illustrating a state in which a plurality of directional members 1310, 1320, 1330, and 1340 according to an embodiment are disposed on the electrical component 350. FIG. 13B is a view illustrating the plurality of directional members 1310, 1320, 1330, and 1340 according to an embodiment. FIG. 13C is a view illustrating the plurality of directional members 1310, 1320, 1330, and 1340 according to an embodiment.

In an embodiment, the plurality of directional members 1310, 1320, 1330, and 1340 may be disposed on at least part of the electrical component 350. The plurality of directional members 1310, 1320, 1330, and 1340 may be disposed in the variable space between the electrical component 350 and the back plate (e.g., the back plate 380 of FIG. 3). The plurality of directional members 1310, 1320, 1330, and 1340 may be disposed to face a predetermined direction. For example, as illustrated in FIG. 13A, the plurality of directional members 1310, 1320, 1330, and 1340 may be disposed across the electrical component 350 from left to right.

In an embodiment, the plurality of directional members 1310, 1320, 1330, and 1340 may be disposed to have substantially the same height as the thickness of the variable space. For example, as illustrated in FIG. 13B, the plurality of directional members 1310, 1320, 1330, and 1340 may be disposed to have the first height H1 in the variable space. In another example, as illustrated in FIG. 13C, the plurality of directional members 1310, 1320, 1330, and 1340 may be disposed to have the second height H2 in the variable space.

In an embodiment, the plurality of directional members 1310, 1320, 1330, and 1340 may be configured to have an orientation. For example, the plurality of directional members 1310, 1320, 1330, and 1340 may be formed of a compressible material, the form of which is able to be variably changed. In another example, the plurality of directional members 1310, 1320, 1330, and 1340 may be formed in an incompressible structure, the direction of which is able to be changed by an external force.

In an embodiment, when the variable space has a specified thickness or more, the plurality of directional members 1310, 1320, 1330, and 1340 may extend in the first direction D1 or the second direction D2 that is perpendicular to the electrical component 350. For example, as illustrated in FIG. 13b, when the variable space has the first height H1, the plurality of directional members 1310, 1320, 1330, and 1340 may extend in the first direction D1 or the second direction D2.

In an embodiment, when the thickness of the variable space is less than the specified thickness, the plurality of directional members 1310, 1320, 1330, and 1340 may extend in a third direction D3 parallel to the electrical component 350. For example, as illustrated in FIG. 13C, when the variable space has the second height H2, the plurality of directional members 1310, 1320, 1330, and 1340 may extend in the third direction D3.

In an embodiment, the vibration damping members described above in relation to FIGS. 6 to 13C may be applied in a sheet form.

Specifically, the vibration damping members may further include a separate base sheet that includes the electrical component 350 and/or the back plate (e.g., the back plate 380 of FIG. 7A) as a base. When the vibration damping members include the base sheet, work efficiency in attaching the vibration damping members may be improved.

In another example, the vibration damping members may be integrally implemented with the electrical component 350 and/or an antenna (e.g., the antenna 370 of FIG. 3) that is mounted in the electronic device 100.

An electronic device (e.g., the electronic device 100 of FIG. 1) according to various embodiments may include a housing including a front plate (e.g., the front plate 320 of FIG. 3) that forms a first surface, a back plate (e.g., the back plate 380 of FIG. 3) that forms a second surface, and a side member (e.g., the side member 118 of FIG. 1) that forms a side surface surrounding a space between the first surface and the second surface, a sound output device (e.g., the sound output device 410 or 421 of FIG. 4) that is disposed in the housing, an electrical component (e.g., the electrical component 350 of FIG. 6) that is disposed in the housing and that has a variable thickness, and a vibration damping member (e.g., the vibration damping member 610 of FIG. 6) that is disposed on at least part of the electrical component 350 or formed between the electrical component 350 and the back plate 380, the vibration damping member being disposed in a variable space having a thickness varying depending on a thickness variation of the electrical component 350. The vibration damping member 610 may have a height varying in a thickness direction of the variable space to correspond to the thickness of the variable space and may divide the variable space into a plurality of sub-spaces when the variable space has a specified thickness or more.

In an embodiment, the vibration damping member 610 may include a first protrusion (e.g., the first protrusion 710 of FIG. 7A) that protrudes in a first direction (e.g., the first direction D1 of FIG. 7A) in which the vibration damping member faces toward the first surface in the variable space and a second protrusion (e.g., the second protrusion 720 of FIG. 7A) that protrudes in a second direction (e.g., the second direction D2 of FIG. 7A) that is opposite to the first direction, and a height difference between the first protrusion 710 and the second protrusion 720 may be substantially the same as the thickness of the variable space.

In an embodiment, the vibration damping member 610 may be disposed such that at least one of the first protrusion 710 and the second protrusion 720 is unfolded, when the thickness of the variable space is less than the specified thickness.

In an embodiment, the electronic device may further include a separate base sheet between the electrical component 350 and the back plate 380, and the base sheet may be attached to the entire surface of a structure including the electrical component 350 or the back plate 380.

In an embodiment, the vibration damping member 610 capable of dividing the variable space may be laminated on and integrally implemented with the electrical component 350 depending on the variable space.

In an embodiment, the vibration damping member 610 may include a first curved portion (e.g., the first curved portion 1111 of FIG. 11A) that is convex in a first direction D1 toward the electrical component in the variable space and a second curved portion (e.g., the second curved portion 1112 of FIG. 11A) that is convex in a second direction D2 opposite to the first direction D1. Heights of the first curved portion 1111 and the second curved portion 1112 may be varied to be substantially the same as a height of the variable space, and the variable space may be divided depending on the first curved portion 1111 and the second curved portion 1112.

In an embodiment, the vibration damping member 610 may include a plurality of expansion parts (e.g., the plurality of expansion parts 1210, 1220, and 1230 of FIG. 12A) that expand in a first direction D1 toward the electrical component 350 and a second direction D2 opposite to the first direction D1 in the variable space, and the plurality of expansion parts 1210, 1220, and 1230 may expand to have substantially the same height as the thickness of the variable space and may make surface-to-surface contact with the electrical component 350 and the back plate 380.

In an embodiment, the vibration damping member 610 may include a plurality of directional members (e.g., the plurality of directional members 1310, 1320, 1330, and 1340 of FIG. 13A) that are disposed on at least part of the electrical component 350, the plurality of directional members 1310, 1320, 1330, and 1340 may be disposed to have substantially the same height as the thickness of the variable space, the plurality of directional members may extend in a first direction D1 or a second direction D2 perpendicular to the electrical component 350 when the variable space has the specified thickness or more, and the plurality of directional members may extend in a third direction (e.g., the third direction D3 of FIG. 13C) parallel to the electrical component 350 when the thickness of the variable space is less than the specified thickness.

An electronic device 100 according to various embodiments may include a housing including a front plate 320 that forms a first surface, a back plate 380 that forms a second surface, and a side member 118 that forms a side surface surrounding a space between the first surface and the second surface, a sound output device 410 or 421 disposed in the housing, an electrical component 350 that is disposed in the housing to form a variable space with the back plate 380 and that has a variable thickness, and a vibration damping member 610 disposed on at least part of the electrical component 350 or disposed in the variable space. The vibration damping member 610 may have a plurality of folds (e.g., the first and second folds 611 and 612 of FIG. 6) that cause the vibration damping member 610 to be folded in the variable space and may divide the variable space into a plurality of sub-spaces while being folded along the plurality of folds 611 and 612, when the variable space has a specified thickness or more.

In an embodiment, the plurality of folds 611 and 612 may include a first fold 611 that causes the vibration damping member 610 to be folded to protrude in a first direction D1 toward the electrical component 350 in the variable space and a second fold 612 that causes the vibration damping member 610 to be folded to protrude in a second direction D2 opposite to the first direction D1, and the first fold 611 and the second fold 612 may be alternately disposed on the vibration damping member 610.

In an embodiment, the plurality of folds 611 and 612 may cause the vibration damping member 610 to be unfolded, when the thickness of the variable space is less than the specified thickness.

In an embodiment, among the plurality of folds (e.g., the plurality of folds 1011, 1012, 1021, and 1022 of FIG. 10C), at least some folds 1011 and 1012 may be disposed to face toward a first edge E1 among edges (e.g., the first and second edges E1 and E2 of FIG. 10C) of the electrical component 350, and the remaining folds 1021 and 1022 may be disposed to face toward a second edge E2 that meets the first edge E1.

In an embodiment, the plurality of folds (e.g., the plurality of folds 1121, 1122, 1131, and 1132 of FIG. 11B) may include a third fold 1121 or 1131 that makes the vibration damping member (e.g., the vibration damping member 1110_1 or 1110_2 of FIG. 11*b*) convex in a first direction D1 toward the electrical component 350 in the variable space and a fourth fold 1122 or 1132 that makes the vibration damping member 1110_1 or 1110_2 convex in a second direction D2 opposite to the first direction D1, and the third fold 1121 or 1131 and the fourth fold 1122 or 1132 may be alternately disposed on the vibration damping member 1110_1 or 1110_2.

In an embodiment, the vibration damping member 1110_1 or 1110_2 may include a plurality of vibration damping members disposed on the electrical component 350, and the third fold 1121 or 1131 and the fourth fold 1122 or 1132 may be disposed to alternate with each other on the plurality of vibration damping members.

In an embodiment, the plurality of folds (e.g., the plurality of folds 1121, 1212, 1213, 1214, 1221, 1222, 1223, 1224, 1231, 1232, 1233, and 1234 of FIG. 12B) may include a fifth fold 1211, 1212, 1221, 1222, 1231, or 1232 that causes the expansion parts (e.g., the expansion parts 1210, 1220, or 1230 of FIG. 12B) to expand in a first direction D1 toward the electrical component 350 in the variable space and a sixth fold 1213, 1214, 1223, 1224, 1233, or 1234 that causes the expansion parts 1210, 1220, or 1230 to expand in a second direction D2 opposite to the first direction D1, and the fifth fold 1211, 1212, 1221, 1222, 1231, or 1232 and the sixth fold 1213, 1214, 1223, 1224, 1233, or 1234 may be disposed to overlap each other in the first direction D1 on the expansion parts 1210, 1220, or 1230.

An electronic device 100 according to various embodiments may include a housing including a front plate 320 that forms a first surface, a back plate 380 that forms a second surface, and a side member 118 that forms a side surface surrounding a space between the first surface and the second surface, a sound output device 410 or 421 disposed in the housing, an electrical component 350 that is disposed in the housing to form a variable space with the back plate 380 and that has a variable thickness, and a vibration damping member 610 disposed on at least part of the electrical component 350 or disposed in the variable space. The vibration damping member 610 may be disposed such that at least part thereof makes contact with the electrical component 350 or the back plate 380, and when the variable space has a specified thickness or more, the vibration damping member may divide the variable space into a plurality of sub-spaces while making contact with the electrical component 350 and the back plate 380 at a plurality of points.

In an embodiment, an area by which the vibration damping member 610 makes contact with the electrical component 350 and the back plate 380 may be decreased with an increase in the thickness of the variable space.

In an embodiment, the variable space (e.g., the variable space 910 of FIG. 9A) may transmit vibration generated from the sound output device 410 or 421 with a first amplitude (e.g., the first amplitude A1 of FIG. 9A), and the plurality of sub-spaces (e.g., the plurality of sub-spaces 911, 912, 913, and 914 of FIG. 9B) may transmit the vibration with a second amplitude (e.g., the second amplitude A2 of FIG. 9B) smaller than the first amplitude A1.

In an embodiment, the vibration damping member 610 may be disposed to entirely make contact with the electrical component 350 and the back plate 380 and so as not to substantially occupy a volume in the variable space, when the thickness of the variable space is less than the specified thickness.

In an embodiment, a length of the vibration damping member 610 in a first direction D1 toward the electrical component 350 may be partially varied in the variable space to correspond to a thickness variation of the electrical component 350.

Figure 14:
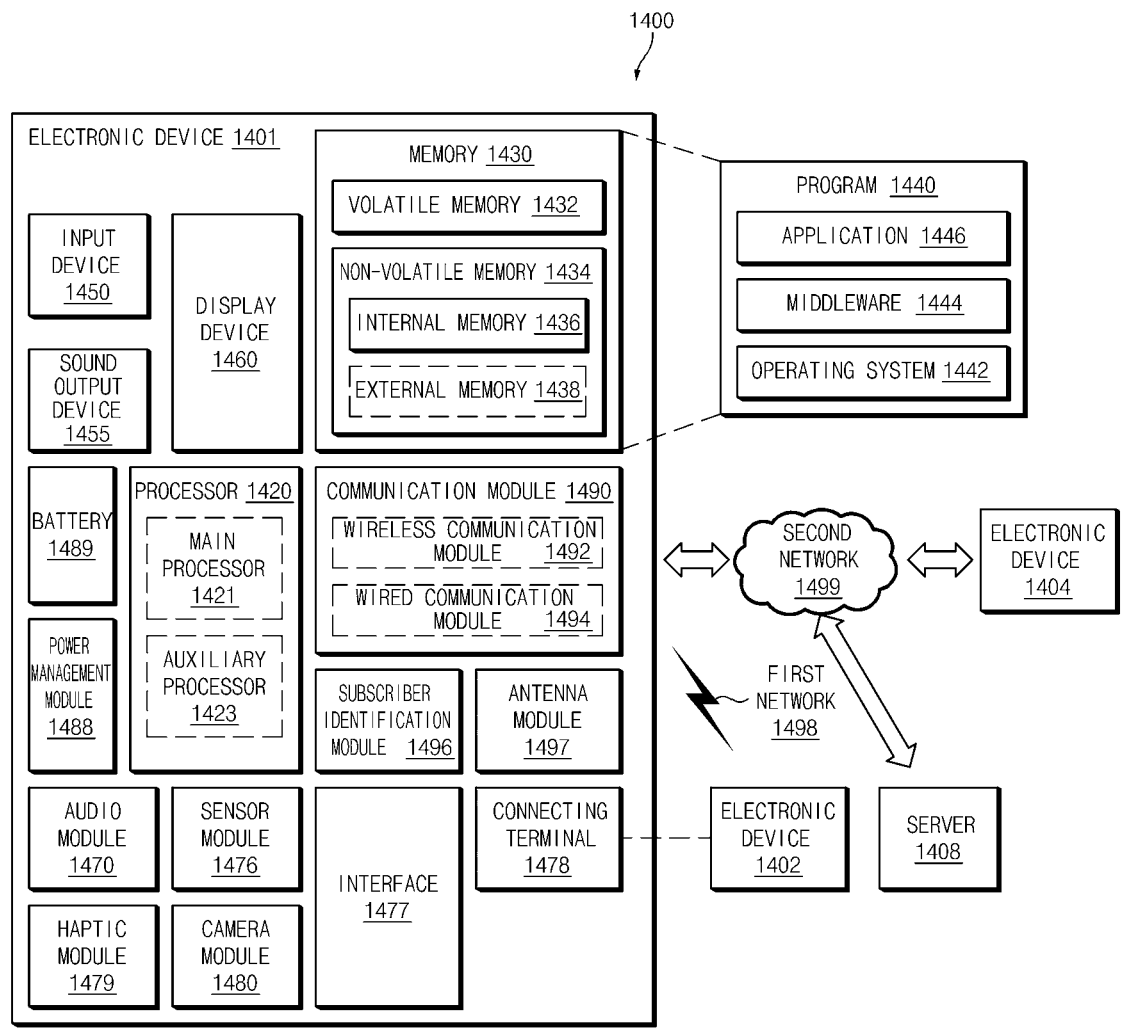
FIG. 14 is a block diagram illustrating an electronic device in a network environment according to various embodiments.

FIG. 14 is a block diagram illustrating an electronic device 1401 in a network environment 1400 according to various embodiments. Referring to FIG. 14, the electronic device 1401 in the network environment 1400 may communicate with an electronic device 1402 via a first network 1498 (e.g., a short-range wireless communication network), or an electronic device 1404 or a server 1408 via a second network 1499 (e.g., a long-range wireless communication network). According to an embodiment, the electronic device 1401 may communicate with the electronic device 1404 via the server 1408. According to an embodiment, the electronic device 1401 may include a processor 1420, memory 1430, an input device 1450, a sound output device 1455, a display device 1460, an audio module 1470, a sensor module 1476, an interface 1477, a haptic module 1479, a camera module 1480, a power management module 1488, a battery 1489, a communication module 1490, a subscriber identification module (SIM) 1496, or an antenna module 1497. In some embodiments, at least one (e.g., the display device 1460 or the camera module 1480) of the components may be omitted from the electronic device 1401, or one or more other components may be added in the electronic device 1401. In some embodiments, some of the components may be implemented as single integrated circuitry. For example, the sensor module 1476 (e.g., a fingerprint sensor, an iris sensor, or an illuminance sensor) may be implemented as embedded in the display device 1460 (e.g., a display).

The processor 1420 may execute, for example, software (e.g., a program 1440) to control at least one other component (e.g., a hardware or software component) of the electronic device 1401 coupled with the processor 1420, and may perform various data processing or computation. According to one embodiment, as at least part of the data processing or computation, the processor 1420 may load a command or data received from another component (e.g., the sensor module 1476 or the communication module 1490) in volatile memory 1432, process the command or the data stored in the volatile memory 1432, and store resulting data in non-volatile memory 1434. According to an embodiment, the processor 1420 may include a main processor 1421 (e.g., a central processing unit (CPU) or an application processor (AP)), and an auxiliary processor 1423 (e.g., a graphics processing unit (GPU), an image signal processor (ISP), a sensor hub processor, or a communication processor (CP)) that is operable independently from, or in conjunction with, the main processor 1421. Additionally or alternatively, the auxiliary processor 1423 may be adapted to consume less power than the main processor 1421, or to be specific to a specified function. The auxiliary processor 1423 may be implemented as separate from, or as part of the main processor 1421.

The auxiliary processor 1423 may control at least some of functions or states related to at least one component (e.g., the display device 1460, the sensor module 1476, or the communication module 1490) among the components of the electronic device 1401, instead of the main processor 1421 while the main processor 1421 is in an inactive (e.g., sleep) state, or together with the main processor 1421 while the main processor 1421 is in an active state (e.g., executing an application). According to an embodiment, the auxiliary processor 1423 (e.g., an image signal processor or a communication processor) may be implemented as part of another component (e.g., the camera module 1480 or the communication module 1490) functionally related to the auxiliary processor 1423.

The memory 1430 may store various data used by at least one component (e.g., the processor 1420 or the sensor module 1476) of the electronic device 1401. The various data may include, for example, software (e.g., the program 1440) and input data or output data for a command related thererto. The memory 1430 may include the volatile memory 1432 or the non-volatile memory 1434.

The program 1440 may be stored in the memory 1430 as software, and may include, for example, an operating system (OS) 1442, middleware 1444, or an application 1446.

The input device 1450 may receive a command or data to be used by other component (e.g., the processor 1420) of the electronic device 1401, from the outside (e.g., a user) of the electronic device 1401. The input device 1450 may include, for example, a microphone, a mouse, a keyboard, or a digital pen (e.g., a stylus pen).

The sound output device 1455 may output sound signals to the outside of the electronic device 1401. The sound output device 1455 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 1460 may visually provide information to the outside (e.g., a user) of the electronic device 1401. The display device 1460 may include, for example, a display, a hologram device, or a projector and control circuitry to control a corresponding one of the display, hologram device, and projector. According to an embodiment, the display device 1460 may include touch circuitry adapted to detect a touch, or sensor circuitry (e.g., a pressure sensor) adapted to measure the intensity of force incurred by the touch.

The audio module 1470 may convert a sound into an electrical signal and vice versa. According to an embodiment, the audio module 1470 may obtain the sound via the input device 1450, or output the sound via the sound output device 1455 or a headphone of an external electronic device (e.g., an electronic device 1402) directly (e.g., wiredly) or wirelessly coupled with the electronic device 1401.

The sensor module 1476 may detect an operational state (e.g., power or temperature) of the electronic device 1401 or an environmental state (e.g., a state of a user) external to the electronic device 1401, and then generate an electrical signal or data value corresponding to the detected state. According to an embodiment, the sensor module 1476 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1477 may support one or more specified protocols to be used for the electronic device 1401 to be coupled with the external electronic device (e.g., the electronic device 1402) directly (e.g., wiredly) or wirelessly. According to an embodiment, the interface 1477 may include, for example, a high definition multimedia interface (HDMI), a universal serial bus (USB) interface, a secure digital (SD) card interface, or an audio interface.

A connecting terminal 1478 may include a connector via which the electronic device 1401 may be physically connected with the external electronic device (e.g., the electronic device 1402). According to an embodiment, the connecting terminal 1478 may include, for example, a HDMI connector, a USB connector, a SD card connector, or an audio connector (e.g., a headphone connector).

The haptic module 1479 may convert an electrical signal into a mechanical stimulus (e.g., a vibration or a movement) or electrical stimulus which may be recognized by a user via his tactile sensation or kinesthetic sensation. According to an embodiment, the haptic module 1479 may include, for example, a motor, a piezoelectric element, or an electric stimulator.

The camera module 1480 may capture a still image or moving images. According to an embodiment, the camera module 1480 may include one or more lenses, image sensors, image signal processors, or flashes.

The power management module 1488 may manage power supplied to the electronic device 1401. According to one embodiment, the power management module 1488 may be implemented as at least part of, for example, a power management integrated circuit (PMIC).

The battery 1489 may supply power to at least one component of the electronic device 1401. According to an embodiment, the battery 1489 may include, for example, a primary cell which is not rechargeable, a secondary cell which is rechargeable, or a fuel cell.

The communication module 1490 may support establishing a direct (e.g., wired) communication channel or a wireless communication channel between the electronic device 1401 and the external electronic device (e.g., the electronic device 1402, the electronic device 1404, or the server 1408) and performing communication via the established communication channel. The communication module 1490 may include one or more communication processors that are operable independently from the processor 1420 (e.g., the application processor (AP)) and supports a direct (e.g., wired) communication or a wireless communication. According to an embodiment, the communication module 1490 may include a wireless communication module 1492 (e.g., a cellular communication module, a short-range wireless communication module, or a global navigation satellite system (GNSS) communication module) or a wired communication module 1494 (e.g., a local area network (LAN) communication module or a power line communication (PLC) module). A corresponding one of these communication modules may communicate with the external electronic device via the first network 1498 (e.g., a short-range communication network, such as Bluetooth™, wireless-fidelity (Wi-Fi) direct, or infrared data association (IrDA)) or the second network 1499 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1492 may identify and authenticate the electronic device 1401 in a communication network, such as the first network 1498 or the second network 1499, using subscriber information (e.g., international mobile subscriber identity (IMSI)) stored in the subscriber identification module 1496.

The antenna module 1497 may transmit or receive a signal or power to or from the outside (e.g., the external electronic device) of the electronic device 1401. According to an embodiment, the antenna module 1497 may include an antenna including a radiating element composed of a conductive material or a conductive pattern formed in or on a substrate (e.g., PCB). According to an embodiment, the antenna module 1497 may include a plurality of antennas. In such a case, at least one antenna appropriate for a communication scheme used in the communication network, such as the first network 1498 or the second network 1499, may be selected, for example, by the communication module 1490 (e.g., the wireless communication module 1492) from the plurality of antennas. The signal or the power may then be transmitted or received between the communication module 1490 and the external electronic device via the selected at least one antenna. According to an embodiment, another component (e.g., a radio frequency integrated circuit (RFIC)) other than the radiating element may be additionally formed as part of the antenna module 1497.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1401 and the external electronic device 1404 via the server 1408 coupled with the second network 1499. Each of the electronic devices 1402 and 1404 may be a device of a same type as, or a different type, from the electronic device 1401. According to an embodiment, all or some of operations to be executed at the electronic device 1401 may be executed at one or more of the external electronic devices 1402, 1404, or 1408. For example, if the electronic device 1401 should perform a function or a service automatically, or in response to a request from a user or another device, the electronic device 1401, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1401. The electronic device 1401 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1440) including one or more instructions that are stored in a storage medium (e.g., internal memory 1436 or external memory 1438) that is readable by a machine (e.g., the electronic device 1401). For example, a processor (e.g., the processor 1420) of the machine (e.g., the electronic device 1401) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to the embodiments of the disclosure, when the thickness of the variable space formed between the electrical component in the electronic device and the back plate is varied, the heights of the vibration damping members may be varied in the thickness direction of the variable space to correspond to the varied thickness. Even though the thickness of the variable space is varied by the electrical component having a variable thickness, the vibration damping members may maintain the state of being attached to the electrical component, thereby preventing vibration of the electrical component.

Furthermore, according to the embodiments of the disclosure, the vibration damping members may be deformed to divide the variable space formed in the electronic device. When air in the electronic device vibrates in the divided variable space, the vibration caused by the air may be divided, and the amplitude of the vibration caused by the air may be decreased.

In addition, the disclosure may provide various effects that are directly or indirectly recognized.

While the disclosure has been shown and described with reference to various embodiments thereof, it will be understood by those skilled in the art that various changes in form and details may be made therein without departing from the spirit and scope of the disclosure as defined by the appended claims and their equivalents.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
   a housing including:
      a front plate configured to form a first surface,
      a back plate configured to form a second surface, and
      a side member configured to form a side surface surrounding a space between the first surface and the second surface;
   a sound output device disposed in the housing;
   an electrical component that is disposed in the housing, the electrical component having a variable thickness; and
   a vibration damping member disposed on at least part of the electrical component or formed between the electrical component and the back plate,
   wherein the vibration damping member is disposed in a variable space having a thickness varying depending on the thickness variation of the electrical component,
   wherein the vibration damping member:
      has a height varying in a thickness direction of the variable space to correspond to the thickness of the variable space, and
      divides the variable space into a plurality of sub-spaces when the variable space has a specified thickness or more.

2. The electronic device of claim 1, wherein the vibration damping member includes:
   a first protrusion protruding in a first direction in which the vibration damping member faces toward the first surface in the variable space; and
   a second protrusion protruding in a second direction opposite to the first direction,
   wherein a height difference between the first protrusion and the second protrusion is substantially equal to the thickness of the variable space.

3. The electronic device of claim 2, wherein the vibration damping member is disposed such that at least one of the first protrusion and the second protrusion is unfolded based on the thickness of the variable space being less than the specified thickness.

4. The electronic device of claim 1, further comprising a separate base sheet between the electrical component and the back plate,
   wherein the base sheet is attached to an entire surface of a structure including the electrical component or the back plate.

5. The electronic device of claim 1, wherein the vibration damping member capable of dividing the variable space is laminated on and integrally implemented with the electrical component depending on the variable space.

6. The electronic device of claim 1, wherein the vibration damping member includes:
   a first curved portion that is convex in a first direction toward the electrical component in the variable space; and
   a second curved portion that is convex in a second direction opposite to the first direction,
   wherein heights of the first curved portion and the second curved portion are varied to be substantially equal to a height of the variable space,
   wherein the variable space is divided depending on the first curved portion and the second curved portion.

7. The electronic device of claim 1, wherein the vibration damping member includes a plurality of expansion parts configured to expand in a first direction toward the electrical component and a second direction opposite to the first direction in the variable space,
   wherein the plurality of expansion parts:
      expand to have a substantially equal height as the thickness of the variable space; and
      make surface-to-surface contact with the electrical component and the back plate.

8. The electronic device of claim 1, wherein the vibration damping member includes a plurality of directional members disposed on at least part of the electrical component,
   wherein each of the plurality of directional members are disposed to have a substantially equal height as the thickness of the variable space,
   wherein each of the plurality of directional members extend in a first direction or a second direction perpendicular to the electrical component based on the variable space being the specified thickness or more,
   wherein each of the plurality of directional members extend in a third direction parallel to the electrical component based on the thickness of the variable space being less than the specified thickness.

9. An electronic device comprising:
   a housing including:
      a front plate configured to form a first surface,
      a back plate configured to form a second surface, and
      a side member configured to form a side surface surrounding a space between the first surface and the second surface;
   a sound output device disposed in the housing;
   an electrical component disposed in the housing to form a variable space with the back plate, the electrical component having a variable thickness; and
   a vibration damping member disposed on at least part of the electrical component or disposed in the variable space,
   wherein the vibration damping member:
      comprises a plurality of folds configured to cause the vibration damping member to be folded in the variable space, and
      divides the variable space into a plurality of sub-spaces while being folded along the plurality of folds based on the variable space being a specified thickness or more.

10. The electronic device of claim 9, wherein the plurality of folds include:
    a first fold configured to cause the vibration damping member to be folded to protrude in a first direction toward the electrical component in the variable space; and
    a second fold configured to cause the vibration damping member to be folded to protrude in a second direction opposite to the first direction, wherein the first fold and the second fold are alternately disposed on the vibration damping member.

11. The electronic device of claim 9, wherein the plurality of folds cause the vibration damping member to be unfolded based on a thickness of the variable space being less than the specified thickness.

12. The electronic device of claim 9, wherein: among the plurality of folds, at least some folds are disposed to face toward a first edge among edges of the electrical component, wherein the remaining folds are disposed to face toward a second edge configured to meet the first edge.

13. The electronic device of claim 9, wherein the plurality of folds include:

a third fold configured to make the vibration damping member convex in a first direction toward the electrical component in the variable space; and a fourth fold configured to make the vibration damping member convex in a second direction opposite to the first direction, wherein the third fold and the fourth fold are alternately disposed on the vibration damping member.

14. The electronic device of claim 13, wherein the vibration damping member includes a plurality of vibration damping members disposed on the electrical component, wherein the third fold and the fourth fold are disposed to alternate with each other on the plurality of vibration damping members.

15. The electronic device of claim 9, wherein the plurality of folds include:

a fifth fold configured to cause the vibration damping member to expand in a first direction toward the electrical component in the variable space; and a sixth fold configured to cause the vibration damping member to expand in a second direction opposite to the first direction, wherein the fifth fold and the sixth fold are disposed to overlap each other in the first direction on the vibration damping member.

16. An electronic device comprising:
a housing including:
a front plate configured to form a first surface,
a back plate configured to form a second surface, and
a side member configured to form a side surface surrounding a space between the first surface and the second surface;
a sound output device disposed in the housing;
an electrical component disposed in the housing to form a variable space with the back plate, the electrical component having a variable thickness; and
a vibration damping member disposed on at least part of the electrical component or disposed in the variable space,
wherein the vibration damping member is disposed such that at least part thereof makes contact with the electrical component or the back plate,
wherein, based on the variable space having a specified thickness or more, the vibration damping member divides the variable space into a plurality of sub-spaces while contacting the electrical component and the back plate at a plurality of points.

17. The electronic device of claim 16, wherein an area by which the vibration damping member makes contact with the electrical component and the back plate is decreased based on an increase in a thickness of the variable space.

18. The electronic device of claim 16, wherein the variable space transmits vibration generated from the sound output device with a first amplitude, wherein the plurality of sub-spaces transmit the vibration with a second amplitude smaller than the first amplitude.

19. The electronic device of claim 16, wherein the vibration damping member is disposed to entirely make contact with the electrical component and the back plate so as not to substantially occupy a volume in the variable space, based on a thickness of the variable space being less than the specified thickness.

20. The electronic device of claim 16, wherein a length of the vibration damping member in a first direction toward the electrical component is partially varied in the variable space to correspond to a thickness variation of the electrical component.

* * * * *